(12) United States Patent
Maruyama et al.

(10) Patent No.: US 8,404,497 B2
(45) Date of Patent: Mar. 26, 2013

(54) SEMICONDUCTOR DEVICE AND METHOD OF MANUFACTURING THE SAME

(75) Inventors: Kazuya Maruyama, Kanagawa (JP); Toshikazu Ishikawa, Kanagawa (JP); Jun Matsuhashi, Kanagawa (JP); Takashi Kikuchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 222 days.

(21) Appl. No.: 12/946,131

(22) Filed: Nov. 15, 2010

(65) Prior Publication Data
US 2011/0140105 A1    Jun. 16, 2011

(30) Foreign Application Priority Data
Dec. 10, 2009   (JP) ................................. 2009-280469

(51) Int. Cl.
*H01L 21/66* (2006.01)
(52) U.S. Cl. ................ 438/15; 438/14; 438/17; 438/18; 438/106; 438/108; 257/698; 257/700; 257/737; 257/E21.529

(58) Field of Classification Search ........................ None
See application file for complete search history.

(56) References Cited

U.S. PATENT DOCUMENTS
2004/0046581 A1 * 3/2004 Maekawa et al. ............. 324/755
2006/0060959 A1   3/2006 Hayashi et al.

FOREIGN PATENT DOCUMENTS
JP   2006-93189 A   4/2006
JP   2009-49170 A   3/2009

* cited by examiner

*Primary Examiner* — Kyoung Lee
(74) *Attorney, Agent, or Firm* — Mattingly & Malur, PC

(57) ABSTRACT

A surface mount type semiconductor device is disclosed. The semiconductor device has testing lands on a lower surface of a wiring substrate with a semiconductor chip mounted thereon. Lower surface-side lands with solder balls coupled thereto respectively and testing lands with solder balls not coupled thereto are formed on a lower surface of a wiring substrate. To suppress the occurrence of contact imperfection between the testing lands and land contacting contact pins provided in a probe socket, the diameter of each testing land is set larger than the diameter of each lower surface-side land. Even when the wiring substrate is reduced in size, electrical characteristic tests using the testing lands can be done with high accuracy.

5 Claims, 30 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2009-280469 filed on Dec. 10, 2009 including the specification, drawings and abstract is incorporated herein by reference in its entirety.

BACKGROUND OF THE INVENTION

The present invention relates to a semiconductor device and a technique for manufacturing the same. Particularly, the present invention is concerned with a surface mount type semiconductor device having testing lands on a lower surface of a wiring substrate with a semiconductor chip mounted thereon, as well as a technique applicable effectively to the manufacture of the semiconductor device.

Semiconductor devices having a surface mount package form such as SiP (System in Package) and BGA (Ball Grid Array) have a structure in which one or plural semiconductor chips (hereinafter referred to merely as the chip) mounted on an upper surface of a wiring substrate called a package substrate are sealed with resin.

Plural wiring lines are formed on an upper surface of the wiring substrate and one ends thereof (bonding leads) and the chip are coupled together electrically through metallic wires or bump electrodes. On the other hand, on a lower surface of the wiring substrate are formed plural lands which are coupled electrically to the above wiring lines through via holes formed within the wiring substrate. These lands configure external terminals of the semiconductor device. The semiconductor device is mounted on a mother board (a package substrate) of any of various electronic devices through solder bumps coupled to these lands.

In addition to the above lands serving as external terminals, testing lands are also provided on the lower surface of the wiring substrate for a semiconductor manufacturer to conduct electrical characteristic tests. In the electrical characteristic tests, metallic contact pins called probes are respectively contacted with the surfaces of the solder bumps and testing lands to determine whether an integrated circuit formed on the chip is good or not or determine whether wiring paths from the chip to lands on the wiring substrate are in conduction or not.

For example, in Patent Document 1 (Japanese Unexamined Patent Publication No. 2006-93189), in connection with an SiP type semiconductor device in which a microcomputer chip and a memory chip are stacked in two stages on an upper surface of a wiring substrate and are sealed with molding resin, there is disclosed a technique of disposing plural electrodes (5c) as external terminals at a peripheral portion of a lower surface of the wiring substrate and further disposing inside the electrodes 5c a plurality of electrodes (5d) as testing terminals to conduct evaluation, reliability test and defect analysis of the memory chip.

Solder bumps are coupled to the electrodes 5c serving as external terminals of the above SiP, while solder bumps are not coupled to the electrodes 5d serving as testing terminals, affording a flat LGA (Land Grid Array). The pitch of adjacent electrodes 5d is the same as that of adjacent electrodes 5c, but the electrodes 5d are smaller in diameter than the electrodes 5c. Further, the surfaces of the electrodes 5d are covered with solder resist to decrease the potential of short-circuit with the solder bumps coupled to the electrodes 5c. For testing the memory chip, the solder resist which covers the surface of each electrode 5d is removed and a probe is contacted with the exposed electrode 5d.

In Patent Document 2 (Japanese Unexamined Patent Publication No. 2009-49170), in connection with a semiconductor device having a surface mount package form like SiP or BGA, there is disclosed a technique in which bumps coupled to external terminals are sorted into those large in diameter and pitch and those small in diameter and pitch and the latter bumps are disposed close to the center of a wiring substrate rather than the former bumps.

A portion of the above large bumps are used for coupling between the semiconductor device and the package substrate, while another portion of the large bumps are not used for coupling with the package substrate but are used for coupling to a screening tester. On the other hand, the small bumps are used neither for coupling to the package substrate nor for coupling to the screening tester. The small bumps are testing bumps which the semiconductor manufacturer uses to test electrical characteristics before shipping.

According to the above configuration, even if a wiring pattern is disposed on the package substrate at a position just under the area of small bumps when the semiconductor device is mounted onto the package substrate through the large bumps, an undesired short-circuit between the wiring pattern and the associated testing bump is avoided. As a result, it is not required to provide a wiring pattern-free area on the package substrate and hence the package-side restriction for suppressing the undesired short-circuit with the testing bump is moderated.

SUMMARY OF THE INVENTION

The present inventors have developed a so-called Package on Package (POP) type semiconductor device in which over a first semiconductor package is stacked a second semiconductor package and chips mounted respectively on the semiconductor packages are coupled together electrically to configure a system.

In the POP type semiconductor device, the function and memory capacity of the chip to be mounted on each semiconductor package can be changed individually. Therefore, in comparison with the foregoing SiP and BGA, various systems matching the purposes of use of products can be implemented inexpensively in a short time. Moreover, since only non-defective first and second semiconductor packages are selected in a test process before their stacking and are thereafter assembled, there also accrues an advantage that the production yield of finished products can be improved.

FIG. 25 is a sectional view showing an entire configuration of a POP type semiconductor device developed by the present inventors. As shown in FIG. 25, this POP type semiconductor device is comprised of a first semiconductor package 100 and a second semiconductor package 200 stacked over the first semiconductor package 100.

The first semiconductor package 100 as a lower package includes a first wiring substrate 101 and a controller chip 102 mounted on an upper surface of the first wiring substrate 101. Plural electrode pads 103 and an integrated circuit (not shown) are formed on a main surface of the controller chip 102. This integrated circuit includes a control circuit for controlling memory chips (a DRAM chip 202 and a flash memory chip 203) mounted on the second semiconductor package 200. The controller chip 102 is disposed in such a manner that its main surface confronts the upper surface of the first wiring substrate 101, and it is face-down-mounted centrally of the upper surface of the first wiring substrate 101.

One ends of plural wiring lines 110 formed on the upper surface of the first wiring substrate 101 configure bonding leads 111, while opposite ends thereof configure upper surface-side lands 112. The upper surface-side lands 112 are lands to which solder balls 208 of the second semiconductor package 200 to be described later are coupled (formed). The bonding leads 111 and corresponding electrode pads 103 of the controller chip 102 are coupled together electrically through conductive members (here, solder balls 104) Further, underfill resin 107 for protecting the main surface of the controller chip 102 is filled in between the upper surface of the first wiring substrate 101 and the main surface of the controller chip 102.

Plural lower surface-side lands 115 and plural testing lands 115L, which are coupled electrically to the wiring lines 110 through via wiring lines (not shown), are formed on a lower surface (back surface) of the first wiring substrate 101. Coupled (formed) to the lower surface-side lands 115 are solder balls 105. The solder balls 105 are formed of a conductive material and serve as external terminals (conduction paths) for input and output of signals and supply potential (or reference potential) between the semiconductor device and an external electronic device. That is, the POP type semiconductor device is mounted on an external electronic device such as a digital camera or a mobile phone through the solder balls 105 coupled to the lower surface-side lands 115. On the other hand, the testing lands 115L configure testing terminals used in an electrical characteristics testing process which is performed after completion of the first semiconductor package 100. Solder balls 105 are not coupled to the testing lands 115L because the testing lands 115L are unnecessary terminals for a customer who mounts the POP type semiconductor device to an external electronic device.

In the electrical characteristics testing process after completion of the first semiconductor package 100, probes are contacted with testing lands 115L to check whether wiring paths from the controller chip 102 to the testing lands 115L are in conduction or not. In this testing process, moreover, probes are put in contact also with the solder balls 105 coupled to the lower surface-side lands 115 to effect an AC/DC test for the controller chip 102 or check whether wiring paths from the controller chip 102 to the solder balls 105 are in conduction or not. Thus, the lower surface-side lands 115 function not only as external terminals but also as testing terminals.

FIG. 26 is a plan view showing a second wiring substrate 201 of the second semiconductor package 200 stacked over the first semiconductor package 100 and FIG. 27 is a sectional view taken along line C-C in FIG. 26.

As shown in FIGS. 25, 26 and 27, the second semiconductor package 200 stacked over the first semiconductor package 100 includes a second wiring substrate 201 having outline dimensions almost equal to that of the first wiring substrate 101 of the first semiconductor package 100, a DRAM chip 202 mounted centrally of an upper surface of the second wiring substrate 201, and a flash memory chip 203 stacked on the DRAM chip 202. With an adhesive 220, the DRAM chip 202 is mounted centrally of the upper surface of the second wiring substrate 201 in such a manner that a back surface thereof confronts the upper surface of the second wiring substrate 201. The flash memory chip 203 is mounted, with the adhesive 220, on the upper surface of the DRAM chip 202.

Plural electrode pads 204 are formed on a main surface of the DRAM chip 202. The electrode pads 204 are coupled electrically to bonding leads 211 of the second wiring substrate 201 through Au wires 206. Further, plural electrode pads 205 are formed on a main surface of the flash memory chip 203. The electrode pads 205 are coupled electrically to bonding leads 211 of the second wiring substrate 201 through Au wires 207. The DRAM chip 202, flash memory chip 203, bonding leads 211 and Au wires 206, 207 are sealed with a resinous sealing body 221. FIG. 26 omits illustration of the resinous sealing body 221.

On a lower surface (back surface) of the second wiring substrate 201 are formed plural lower surface-side lands 213 which are coupled electrically to the bonding leads 211 through via wiring lines 212. The number of the lower surface-side lands 213 is the same as that of the upper surface-side lands 112 formed on the upper surface of the first wiring substrate 101 in the first semiconductor package 100. When the second semiconductor package 200 is stacked over the first semiconductor package 100, the lower surface-side lands 213 of the second semiconductor package 200 and the upper surface-side lands 112 of the first semiconductor package 100 confront each other.

Solder balls 208 are coupled respectively to surfaces of the lower surface-side lands 213 which configure external terminals of the second semiconductor package 200. The solder balls 208 are formed of a material higher in melting point than the solder balls 105 coupled to the lower surface-side lands 115 of the first semiconductor package 100. The second semiconductor package 200 is coupled electrically to the first semiconductor package 100 as a lower package through the solder balls 208.

In the testing process for the first semiconductor package 100 which is performed before assembly of the above POP type semiconductor device, the first semiconductor package 100 is placed into a probe socket with a probe card incorporated therein. Then, various electrical characteristic tests are performed while plural probes (hereinafter referred to as "contact pins" as the case may be) provided in the probe socket are contacted with the solder balls and testing lands formed on the lower surface of the first wiring substrate 101.

However, according to studies made by the present inventors, as the lands (the lower surface-side lands 115 and testing lands 115L) formed on the lower surface of the first wiring substrate 101 become smaller in both diameter and land-to-land pitch with the reduction in size of the POP type semiconductor, the probe-land alignment accuracy is deteriorated and in the worse case there occurs the problem that accurate electrical characteristic tests can no longer be performed due to non-contact between probes and lands.

FIG. 28 is a schematic sectional view showing contact portions between lands (lower surface-side land 115 and testing land 115L) formed on the lower surface of the first wiring substrate 101 and probes (contact pins) provided in the probe socket.

In a socket body 11 of the probe socket are incorporated a plurality of ball coupling contact pins 13B and a plurality of land contacting contact pins 13L. One ball coupling contact pin 13B and one land contacting contact pin 13L are shown in FIG. 28. The ball coupling contact pin 13B is a probe for contact with a solder ball 105 which is attached to a lower surface-side land 115 of the first wiring substrate 101, while the land contacting contact pin 13L is a probe for contact with a testing land 115L.

The ball coupling contact pin 13B and the land contacting contact pin 13L are each of a structure in which the pin is moved vertically with the biasing force of a coiled spring installed within a pin guide 15 provided in the socket body 11. A solder ball 105 is inserted into the vicinity (a ball guide 16) of a tip portion (upper end portion) of the pin guide 15 into which the ball coupling contact pin 13B is inserted. Therefore, the diameter of the ball guide 16 is larger than that of the pin guide 15. In other words, the solder ball 105 is disposed within the ball guide 16 connected with the pin guide 15.

FIG. 28(a) shows a state in which the ball coupling contact pin 13B and the solder ball 105 are in an ideal contact with each other and so are the land contacting contact pin 13L and the testing land 115L. In this state, the ball coupling contact pin 13B and the solder ball 105 are aligned with each other and so are the land contacting contact pin 13L and the testing land 115L.

On the other hand, FIG. 28(b) shows a state in which the ball coupling contact pin 13B and the solder ball 105 are most deviated from each other positionally and so are the land contacting contact pin 13L and the testing land 115L. In the illustrated state, the first wiring substrate 101 is deviated in the left direction (the arrowed direction in the figure) relative to the socket body 11. At this time, the solder ball 105 contacts with an inner wall surface (the left inner wall surface) of the ball guide 16. The land contacting contact pin 13L and the ball coupling contact pin 13B each contact with an inner wall surface (the right inner wall surface) of the pin guide 15.

The first wiring substrate 101 is designed so that the ball coupling contact pin 13B and the solder ball 105 do not become out of contact with each other, nor do the land contacting contact pin 13L and the testing land 115L, even when the positional deviation between the ball coupling contact pin 13B and the solder ball 105 and that between the land contacting contact pin 13L and the testing land 115L each become maximum as mentioned above.

Actually, however, the first wiring substrate 101 and the probe socket 10 each involve variations in machining. Besides, since the first wiring substrate 101 and the controller chip 102 formed on the upper surface of the first wiring substrate 101 are formed of materials different in the coefficient of thermal expansion, there occurs warping of the first wiring substrate 101 due to, for example, heat which the controller chip 102 generates during operation. This warp is more marked at the peripheral portion than at the central portion of the first wiring substrate 101, so that the land-probe positional deviation caused by the warp is marked at the lands arranged in the peripheral portion of the first wiring substrate 101. Gaps are formed respectively between the inner wall surfaces of the pin guides 15 and the surfaces of the contact pins 13B, 13L in order to permit vertical movements of the contact pins 13B and 13L within the pin guides 15 respectively. In other words, the contact pin diameter is smaller than the guide diameter. Further, although plural solder balls 105 are formed on the lower surface of the wiring substrate, there is a fear that the positions of the lower surface-side lands 115 with the solder balls 105 disposed thereon may be deviated from the positions which the lower surface-side lands should occupy, due to variations in machining. Once there occurs a positional deviation of a lower surface-side land 115, the position of the solder ball 105 formed on the deviated lower surface-side land 115 also deviates. Therefore, the diameter of the ball guide 16 is set larger than that of the pin guide 15 so that the solder ball 105 can be positively received within the guide (ball guide 16) provided in the socket body 11.

As a result, when the first wiring substrate 101 is placed into the socket body 11 of the probe socket, the amount of a positional deviation between the ball coupling contact pin 13B and the solder ball 105 or the amount of a positional deviation between the land contacting contact pin 13L and the testing land 115L may exceed an allowable range in design shown in FIG. 28(b).

At this time, if the lands (the lower surface-side lands 115 and testing lends 115L) formed on the lower surface of the first wiring substrate 101 are sufficiently large in diameter, there is no fear of occurrence of a non-contact state between lands and contact pins. However, as the land diameter and the land-to-land pitch become smaller with the reduction in size of the first wiring substrate 101, there is a fear of occurrence of a non-contact state between the land contacting contact pin 13L and the testing land 115L when the amount of a positional deviation between the two land exceeds the aforesaid allowable range.

That is, when attention is paid to the contact portion between the land contacting contact pin 13L and the testing land 115L, it is seen that a tip portion (upper end portion) of the land contacting contact pin 13L is in a so-called single needle shape which is in contact at one point with the testing land 115L as a flat land. More particularly, a planar shape of the tip portion (upper end portion) of the land contacting contact pin 13L, (a planar shape of the contact pin 13L as viewed from the testing land 115L side in FIG. 28), is circular and a vertex of the needle is located centrally of the tip portion (upper end portion) of the land contacting contact pin 13L. One projection is formed centrally of the tip portion (upper end portion) of the land contacting contact pin 13L. Therefore, if an aperture radius of the land contacting contact pin 13L, (the radius of the portion exposed from solder resist 106 which covers the peripheral portion of the testing land 115L), becomes smaller than the foregoing allowable range, there is a fear that the contact pin and the testing land may become out of contact with each other as shown in FIG. 29.

On the other hand, a solder ball 105 projecting more downwards than the lower surface of the first wiring substrate 101 is coupled to the lower surface-side land 115. A tip portion (upper end portion) of the ball coupling contact pin 13B is in a so-called crown shape which comes in contact with the spherical solder ball 105 at plural points. In more particular terms, a planar shape of the tip portion (upper end portion) of the ball coupling contact pin 13B, (a planar shape of the contact pin 13B as viewed from the lower surface-side land 115 in FIG. 28), is circular and plural projections are disposed (formed) along the peripheral edge of the tip end portion. Therefore, even when the radius of the lower surface-side land 115 or of the solder ball 105 becomes smaller than the foregoing allowable range, a non-contact state between the solder ball 105 and the ball coupling contact pin 13B is difficult to occur.

Thus, as the lands (the lower surface-side lands 115 and the testing lands 115L) formed on the lower surface of the first wiring substrate 101 become smaller in diameter with the reduction in size of the POP type semiconductor device, contact imperfection between the testing lands 115L with solder balls 105 not coupled thereto and the land contacting contact pins 13L becomes easier to occur and hence electrical characteristic tests for the first semiconductor package 100 using the testing lands 115L can no longer be conducted with high accuracy.

In connection with a surface mount type semiconductor device having testing lands formed on a lower surface of a wiring substrate with a chip mounted thereon, it is an object of the present invention to provide a technique capable of performing electrical characteristic tests using the testing lands with high accuracy even in the case where the wiring substrate is reduced in size.

It is another object of the present invention to provide a technique which promotes the reduction in size of a surface mount type semiconductor device having testing lands formed on a lower surface of a wiring substrate with a chip mounted thereon.

The above and other objects and novel features of the present invention will become apparent from the following description and the accompanying drawings.

The following is an outline of typical inventions out of the inventions disclosed herein. (1) A method of manufacturing a semiconductor device in a preferred aspect of the present invention comprises the steps of providing an assembly including a wiring substrate having a first land, a second land larger in diameter than the first land, and a conductive member formed on the first land and serving as an external terminal, and a semiconductor chip mounted over an upper surface of the wiring substrate, and placing the assembly into a probe socket, contacting a first contact pin of the probe socket with the conductive member, contacting a second contact pin of the probe socket with the second land, and performing electrical characteristic tests for the assembly, in which the conductive member is not coupled to the second land and the second land is used only for performing the electrical characteristic tests for the semiconductor device. (2) A semiconductor device in another preferred aspect of the present invention comprises a wiring substrate having a plurality of lands and a semiconductor chip mounted over the wiring substrate, the lands including a first land to which a conductive member serving as an external terminal of the semiconductor device is coupled and a second land to which the conductive member is not coupled and which is used only for performing electrical characteristic tests for the semiconductor device, the second land being larger in diameter than the first land.

The following is a brief description of an effect obtained by the typical inventions out of the inventions disclosed herein.

According to the above preferred aspects of the present invention, in a surface mount type semiconductor device having testing lands on a lower surface of a wiring substrate with a chip mounted thereon, electrical characteristic tests using the testing lands can be performed with high accuracy even in the case where the wiring substrate is reduced in size.

DETAILED DESCRIPTION OF THE PREFERRED EMBODIMENT

Figure 1:
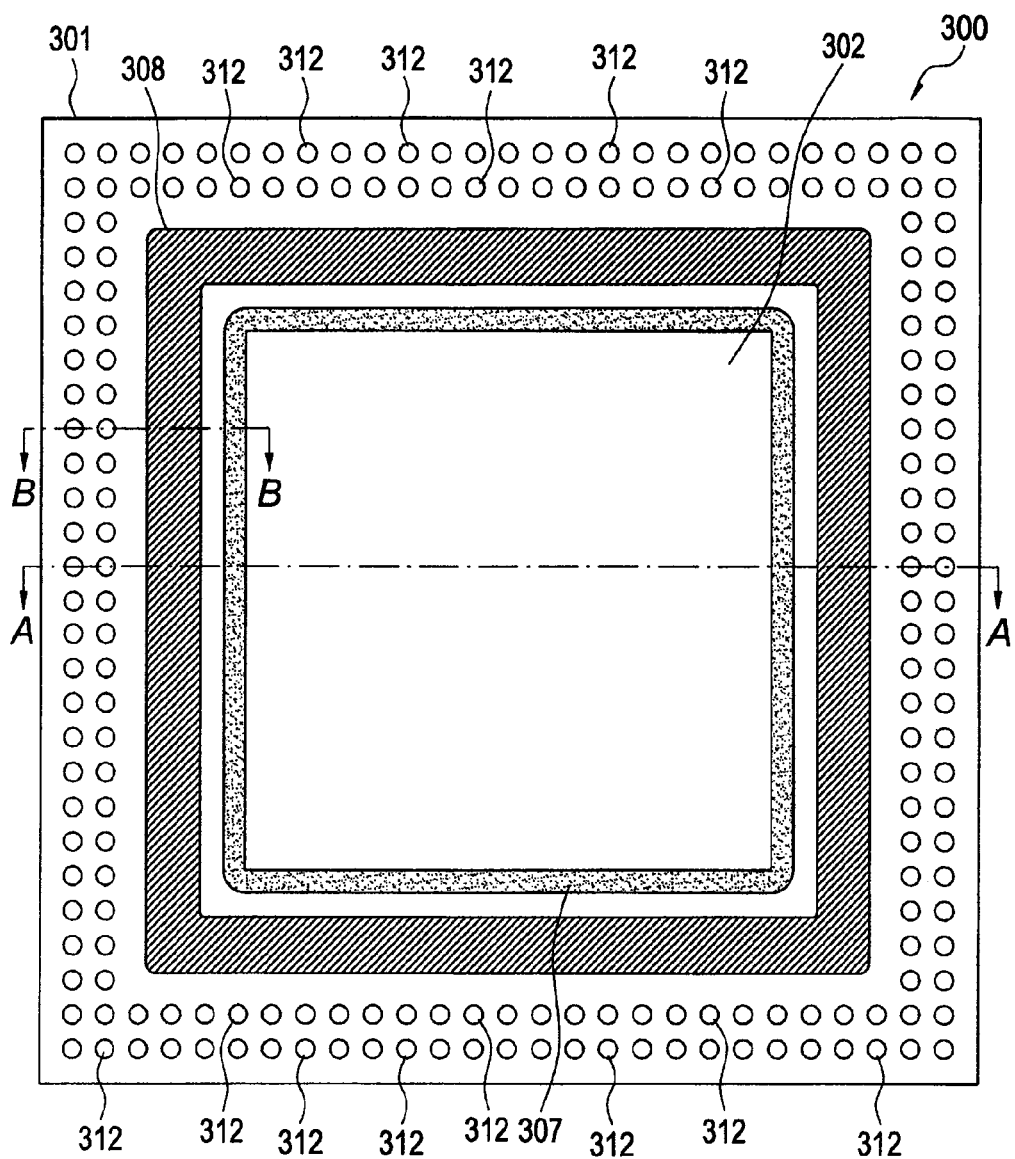
FIG. 1 is a plan view showing a first semiconductor package of a POP type semiconductor device according to an embodiment of the present invention.

An embodiment of the present invention will be described below in detail with reference to the accompanying drawings. In all of the drawings for illustrating the embodiment, members having the same functions are identified by the same reference numerals, and repeated explanations thereof will be omitted. In the following embodiments, explanations of the same or similar portions will not be repeated in principle except when such explanations are specially needed. In the drawings for illustrating the following embodiment, even a plan view may be hatched to make the associated configuration easier to understand.

This embodiment is the application of the present invention to a POP type semiconductor device in which over a first semiconductor package (first semiconductor device, lower stage-side package) with a controller chip on board is stacked a second semiconductor package (second semiconductor device, upper state-side package) with a memory chip on board to configure a system.

<First Semiconductor Package (First Semiconductor Device)>

Figure 2:
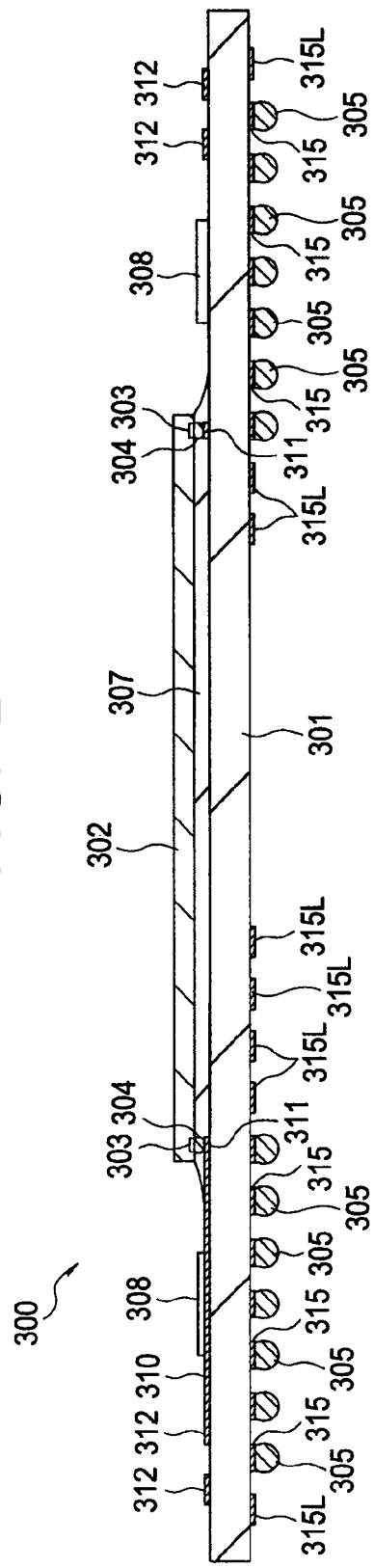
FIG. 2 is a sectional view of the first semiconductor package taken along line A-A in FIG. 1.
Figure 3:
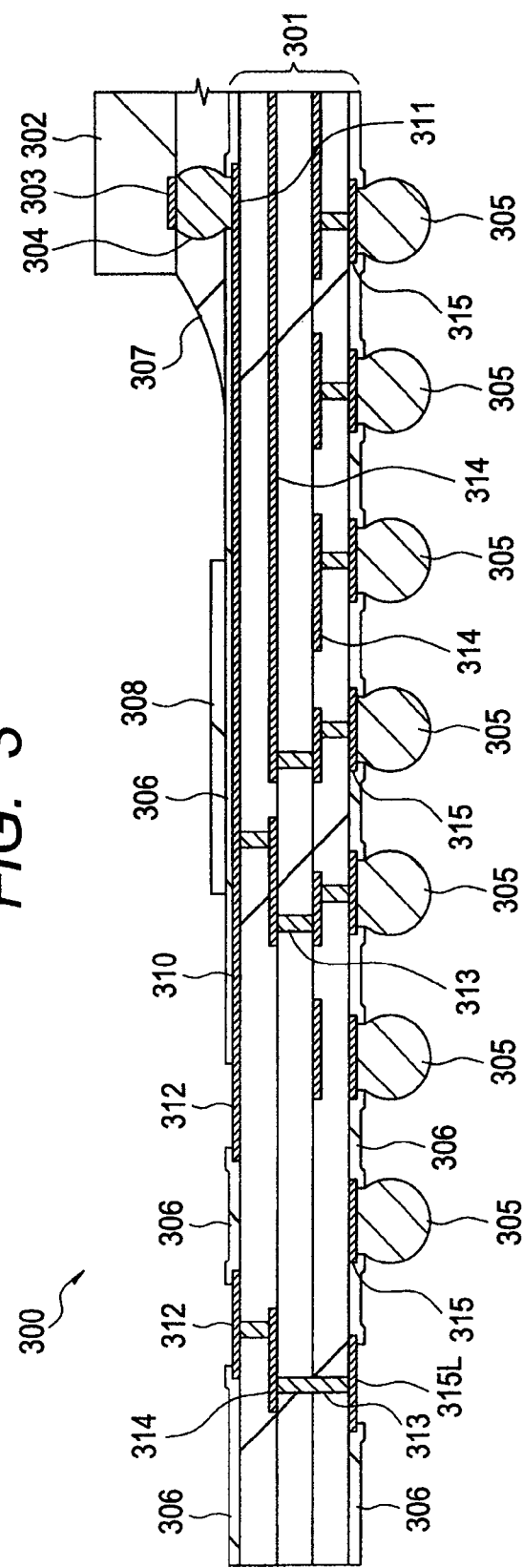
FIG. 3 is an enlarged sectional view of a principal portion of the first semiconductor package taken along line B-B in FIG. 1.

FIG. 1 is a plan view showing a first semiconductor package of a POP type semiconductor device, FIG. 2 is a sectional view of the first semiconductor package taken along line A-A in FIG. 1, and FIG. 3 is an enlarged sectional view of a principal portion of the first semiconductor package taken along line B-B in FIG. 1.

A first semiconductor package 300 which configures a lower stage-side package of a POP type semiconductor device includes a wiring substrate 301 and a controller chip (first semiconductor chip) 302 mounted on a central part of an upper surface of the wiring substrate 301.

The wiring substrate 301 is a multilayer wiring substrate mainly comprised of a general-purpose resin, e.g., glass fabric-based epoxy resin, and wiring layers. Its planar shape is, for example, quadrangular (square). Plural wiring lines 310 are formed on an upper surface (surface, main surface) of the wiring substrate 301. One ends of the wiring lines 310 configure bonding leads (electrode pads) 311 respectively and opposite ends thereof configure upper surface-side lands (electrode pads) 312. FIG. 1 illustrates only the opposite ends (upper surface-side lands 312) of the wiring lines 310 respectively.

As shown in FIG. 3, the upper surface of the wiring substrate 301, exclusive of the surfaces of one ends (bonding leads 311) and of the opposite ends (upper surface-side lands 312) of the wiring lines 310, is covered with solder resist 306 which is an insulating resin film for protecting the wiring lines 310. Plating layers (not shown) which are two metallic film layers comprising, for example, a nickel (Ni) layer and an Au layer stacked thereon are formed on the surfaces of the bonding leads 311 and of the upper surface-side lands 312 exposed from the solder resist 306.

Plural lower surface-side lands (ball mounting lands) 315 and plural testing lands 315L are formed on a lower surface (back surface) of the wiring substrate 301. The lower surface-side lands 315 and the testing lands 315L are electrically coupled respectively to the wiring lines 310 on the upper surface of the wiring substrate 301 through plural via wiring lines 313 formed in the interior of the wiring substrate 301 and internal wiring lines 314 of plural layers (e.g., two layers). That is, the wiring substrate 301 is a four-layer wiring substrate comprising the wiring lines 310 formed on the upper surface of the wiring substrate 301 as a first wiring layer, the lower surface-side lands 315 and the testing lands 315L as a second wiring layer, and the two-layer internal wiring lines 314 as third and fourth wiring layers. These four-layer wiring lines (wiring lines 310, internal wiring lines 314, lower surface-side lands 315, testing lands 315L) and the via wiring lines 313 which couple them are formed of a low resistance metal, e.g., copper (Cu). The lower surface of the wiring substrate 301, exclusive of the surfaces of the lower surface-side lands 315 and the surfaces of the testing lands 315L), is covered with solder resist 306.

External terminals (conduction paths) for input and output of signals and supply potential (or reference potential) between the semiconductor device and an external electronic device are coupled (formed) to the lower surface-side lands 315 formed on the lower surface of the wiring substrate 301. In this embodiment, the external terminals are each formed by a conductive member, e.g., a solder ball, (hereinafter referred to as solder balls 305). The solder balls 305 are coupled to electrode pads of a mother board (a package substrate) in an external electronic device such as a digital camera or a mobile phone and the POP type semiconductor device is mounted on the mother board (package substrate) through the solder balls 305. The solder balls 305 are formed of, for example, tin (Sn) alone or Sn alloy comprising Sn and a small amount of bismuth (Bi), zinc (Zn), silver (Ag), or Cu.

The testing lands 315L formed on the lower surface of the wiring substrate 301 are terminals used in only electrical characteristic tests which are performed after completion of the first semiconductor package (assembly) 300. That is, the testing lands 315L are terminals not used by a customer who mounts the POP type semiconductor device onto the mother board of an external electronic device. For this reason, solder bumps are not coupled to the surfaces of the testing lands 315L, affording a flat LGA configuration. As to electrical characteristic tests for the first semiconductor package 300, using the testing lands 315L, a description will be given later.

The controller chip 302 mounted on the upper surface of the wiring substrate 301 comprises a single crystal silicon substrate having a generally square plane shape. The controller chip 302 is face-down-mounted centrally of the upper surface of the wiring substrate 301 in such a manner that a main surface thereof (an integrated circuit-formed surface) confronts the upper surface of the wiring substrate 301. Plural electrode pads 303 are formed at the peripheral portion of the main surface of the controller chip 302. On the silicon substrate inside the electrode pads 303 is formed a control circuit for controlling a memory chip of a second semiconductor package stacked over the first semiconductor package 300.

The electrode pads 303 formed on the main surface of the controller chip 302 and one ends (bonding leads 311) of the wiring lines 310 formed on the upper surface of the wiring substrate 301 are coupled together electrically. That is, the controller chip 302 is flip-chip-mounted on the upper surface of the wiring substrate 301 through solder balls 304. Like the solder balls 305 coupled to the lower surface-side lands 315 of the wiring substrate 301, the solder balls 304 are formed of Sn alloy comprising Sn and a small amount of Bi, Zn, Ag, or Cu, but the melting point thereof is higher than that of the solder balls 305.

Underfill resin 307 for protecting the main surface of the controller chip 302 is filled in between the upper surface of the wiring substrate 301 and the main surface of the controller chip 302. The underfill resin 307 has also a function of relaxing a thermal stress exerted on the interface between the control chip 302 and the wiring substrate 301, which is caused by a difference in the coefficient of thermal expansion between the two. The underfill resin 307 is, for example, a one-component type thermosetting epoxy resin.

In the vicinity of the outer periphery of the controller chip 302 mounted on the upper surface of the wiring substrate 301 there is provided a dam 308 having a quadrangular frame-like plane shape. The dam 308 is disposed so as to enclose the controller chip 302. The dam 308 is formed for preventing liquid underfill resin 307 from being diffused to the peripheral portion of the upper surface of the wiring substrate 301 and covering end portions (upper surface-side lands 312) of the wiring lines 310 when the liquid underfill resin 307 is supplied between the upper surface of the wiring substrate 301 and the main surface of the controller chip 302. The dam 308 is an insulating resin film formed of the same material (e.g., epoxy resin) as that of the solder resist 306 which covers the upper surface of the wiring substrate 301. As shown in FIG. 3, the dam 308 is bonded to an upper surface of the solder resist 306.

Figure 4:
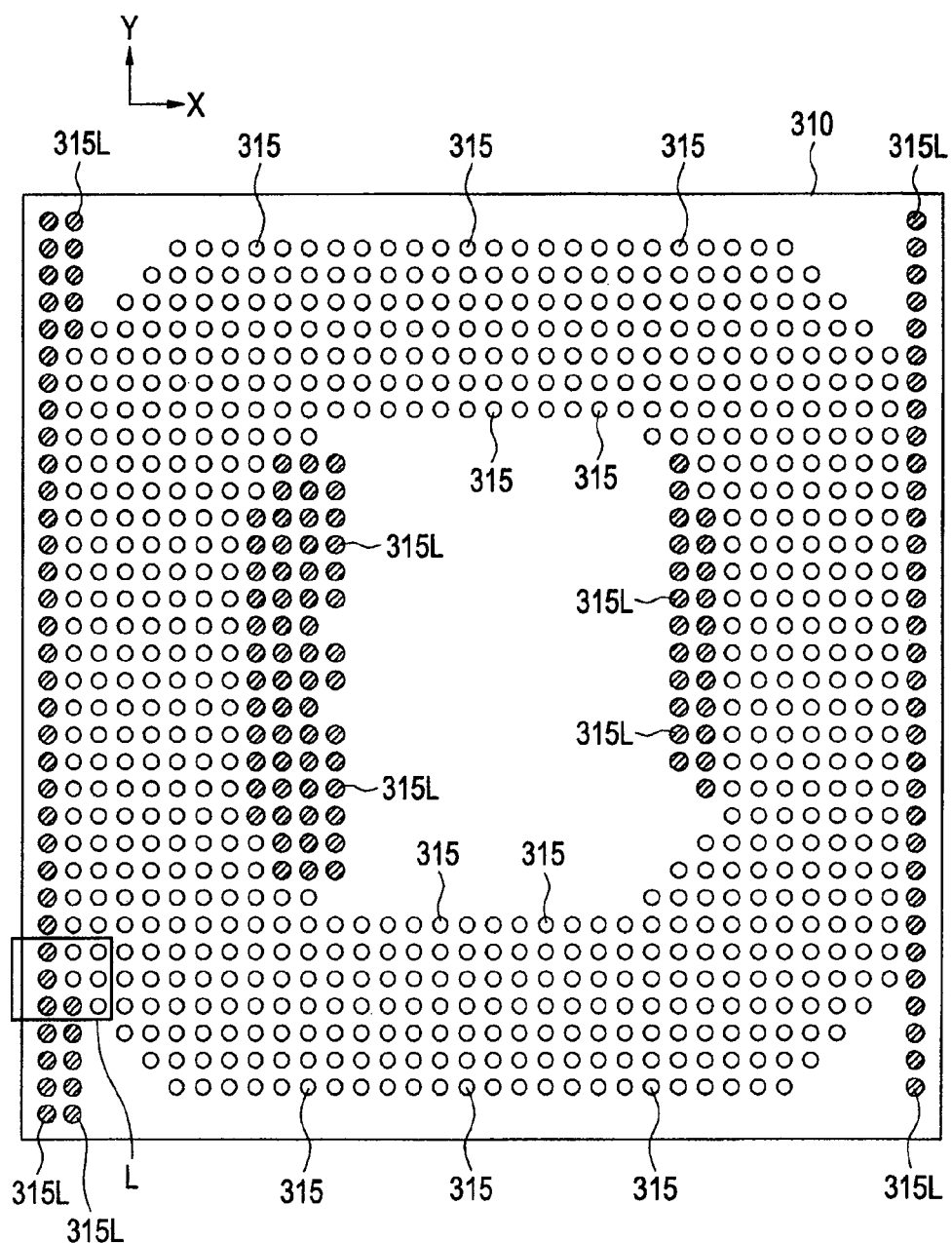
FIG. 4 is a plan view showing a layout of lower surface-side lands and testing lands formed on a wiring substrate of the first semiconductor package.

FIG. 4 is a plan view showing a layout of the lower surface-side lands 315 and testing lands 315L formed on the lower surface of the wiring substrate 301. Illustration of the solder balls 305 coupled to the lower surface-side lands 315 is omitted. To make distinction from the lower surface-side lands 315, the testing lands 315L is hatched.

As shown in FIG. 4, the lower surface-side lands 315 and the testing lands 31L are arranged in an array form on the lower surface of the wiring substrate 301. The lower surface-side lands 315 are arranged mainly in seven rows in a direction of one side from the central part of the wiring substrate 301, that is, in both X direction (a direction parallel to one side of the wiring substrate 301) and Y direction orthogonal thereto. On the other hand, the testing lands 315L are arranged mainly in the vicinity of the central part of the wiring substrate 301 (inside the lower surface-side land rows) and also at the outermost periphery portion (outside the lower surface-side land rows).

Though not shown, the second semiconductor package stacked over the first semiconductor package 300 according to this embodiment includes a wiring substrate and two memory chips mounted on an upper surface of the wiring substrate. One of the two memory chips is a DRAM-formed chip and the other is a flash memory-formed chip.

Of the testing lands 315L formed on the lower surface of the wiring substrate 301, those arranged near the central part of the wiring substrate 301 (inside the lower surface-side land rows) mainly configure lands for flash memory chip interface. On the other hand, the testing lands 315L arranged at the outermost periphery portion of the wiring substrate 301 (outside the lower surface-side land rows) mainly configure lands for DRAM chip interface. Of the via wiring lines 313 formed in the interior of the wiring substrate 301, those arranged near the central part of the wiring substrate 301 mainly configure via wiring lines for flash memory chip interface, while those arranged near the outer periphery portion of the wiring substrate 301 mainly configure via wiring lines for DRAM chip interface.

Generally, the DRAM driving frequency is higher than the flash memory driving frequency. Therefore, as the wiring length of the path from the controller chip 302 to each DRAM chip interfacing land becomes larger, the wiring impedance component increases and the wiring lines are more likely to pick up unnecessary noises, which may result in deterioration of the reliability (electrical characteristics) of the POP type semiconductor device. On the other hand, as noted above, in the case where the DRAM chip interfacing lands are arranged at the outermost periphery portion of the wiring substrate 301 and the DRAM chip interfacing via wiring lines 313 are arranged near the outer periphery portion of the wiring substrate 301, the wiring length of the path from the controller chip 302 mounted on the upper surface of the wiring substrate 301 to each testing land 315L for DRAM chip interface is made shortest, whereby the aforesaid inconvenience is avoided.

Figure 5:
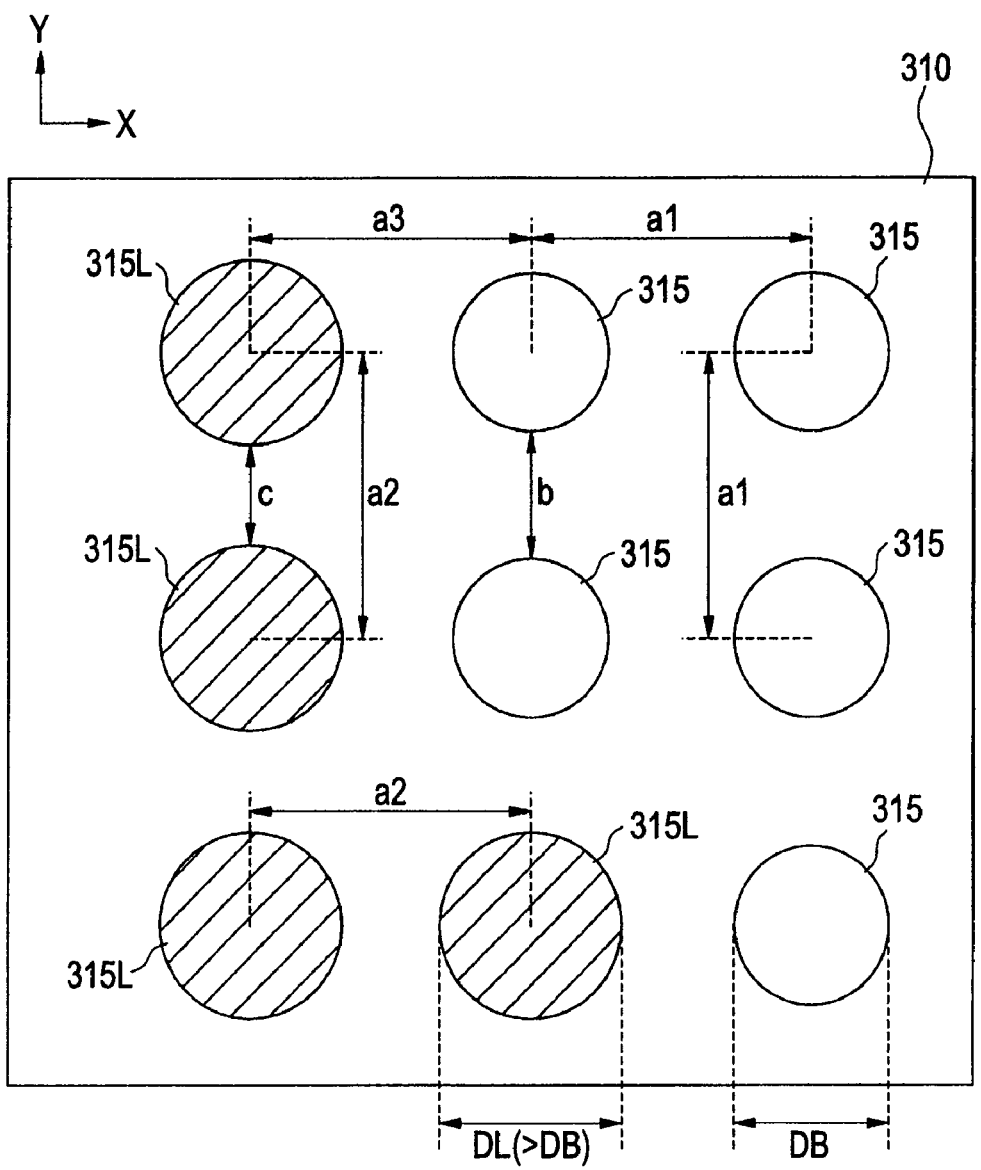
FIG. 5 is a plan view showing a part of FIG. 4 on a larger scale.

FIG. 5 is a plan view showing on a larger scale an area L enclosed with a solid line in FIG. 4. As shown in FIG. 5, a pitch a1 between adjacent lower surface-side lands 315, a pitch a2 between adjacent testing lands 315L, and a pitch a3 between adjacent lower surface-side land 315 and testing land 315L, are the same (a1=a2=a3). For example, they are each 0.4 mm. That is, the lower surface-side lands 315 and the testing lands 315L are arranged at equal pitches in the X and Y directions.

The spacing, b, between adjacent lower surface-side lands 315 in the X direction and that in the Y direction are each, for example, 0.1 mm. On the other hand, the spacing, c, between adjacent testing lands 315L in the X direction and that in the Y direction are each, for example, 0.07 mm. That is, in the wiring substrate 301 used in this embodiment, the diameter DL of each testing land 315L is larger than the diameter DB of each lower surface-side land 315 (an external terminal to which a solder ball 305 is coupled). For example, the diameter DL of each testing land 315L is 0.33 mm and the diameter DB of each lower surface-side land 315 is 0.3 mm. As to the effect obtained by making the diameter DL of each testing land 315L larger than the diameter DB of each lower surface-land 315, it will be described later.

<Method of Manufacturing the First Semiconductor Package>

Next, with reference to FIGS. 6 to 12, a description will be given below about a method of manufacturing the first semiconductor package 300 configured as above.

Figure 6:
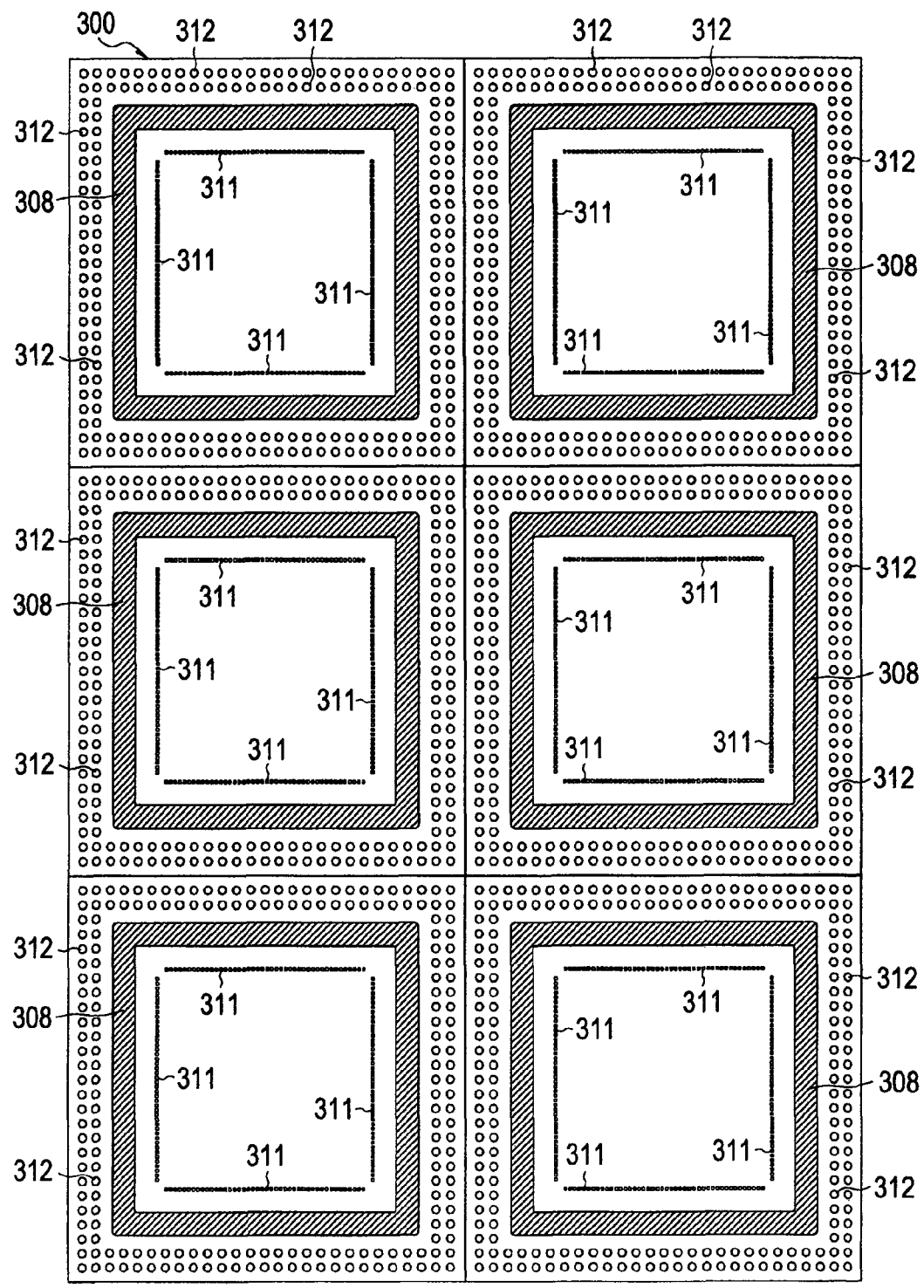
FIG. 6 is a plan view showing an upper surface of a matrix substrate used in manufacturing the first semiconductor package.
Figure 7:
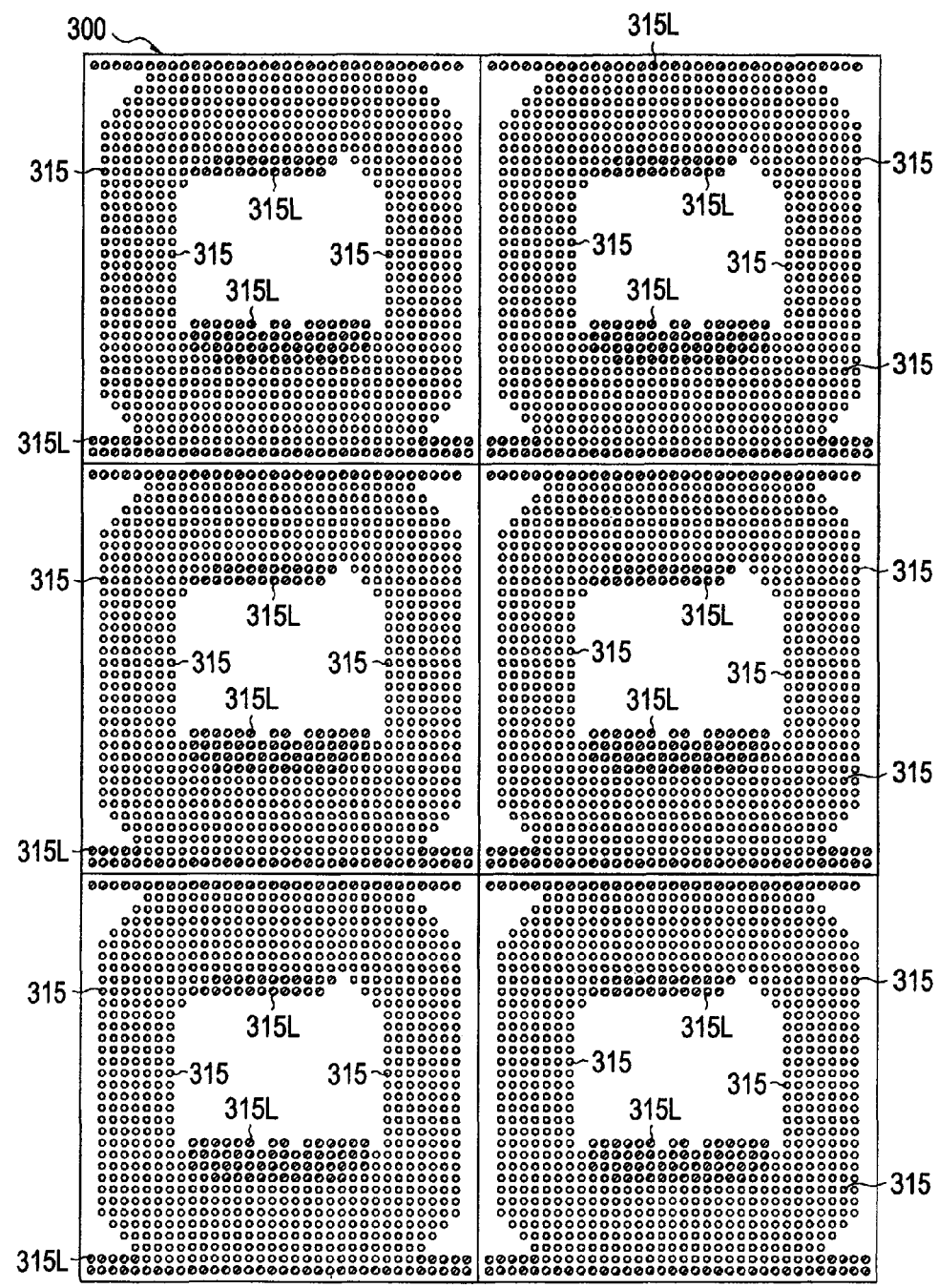
FIG. 7 is a plan view showing a lower surface of the matrix substrate used in manufacturing the first semiconductor package.
Figure 8:
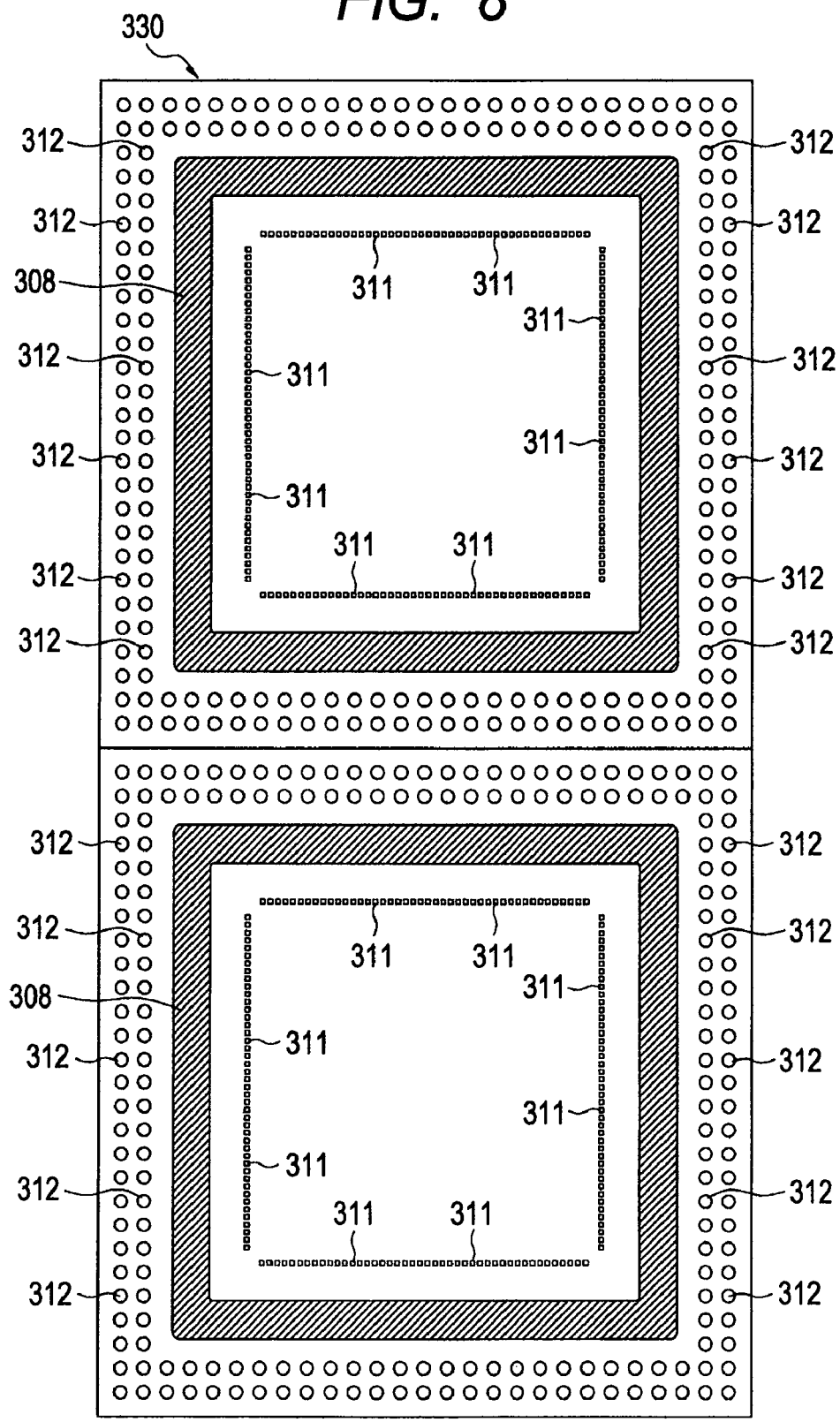
FIG. 8 is a plan view showing a part of FIG. 6 on a larger scale.

FIG. 6 is a plan view showing an upper surface (surface) of a matrix substrate (a large-sized wiring substrate) 330 which is used in manufacturing the first semiconductor package 300, FIG. 7 is a plan view showing a lower surface (back surface) of the matrix substrate 330, and FIG. 8 is a plan view showing a part (an area corresponding to two wiring substrates) of FIG. 6 on a larger scale.

The matrix substrate 330 has a structure in which the conductor patterns of the wiring substrate 301 described above, (wiring lines 310, bonding leads 311, upper surface-side lands 312, via wiring lines 313, internal wiring lines 314, lower surface-side lands 315, testing lands 315L), are formed repeatedly. The matrix substrate 330 is a substrate serving as a matrix of the wiring substrate 301 in the first semiconductor package 300. By dicing the matrix substrate 330 there are obtained a large number (e.g., six) of wiring substrates 301.

Figure 9:
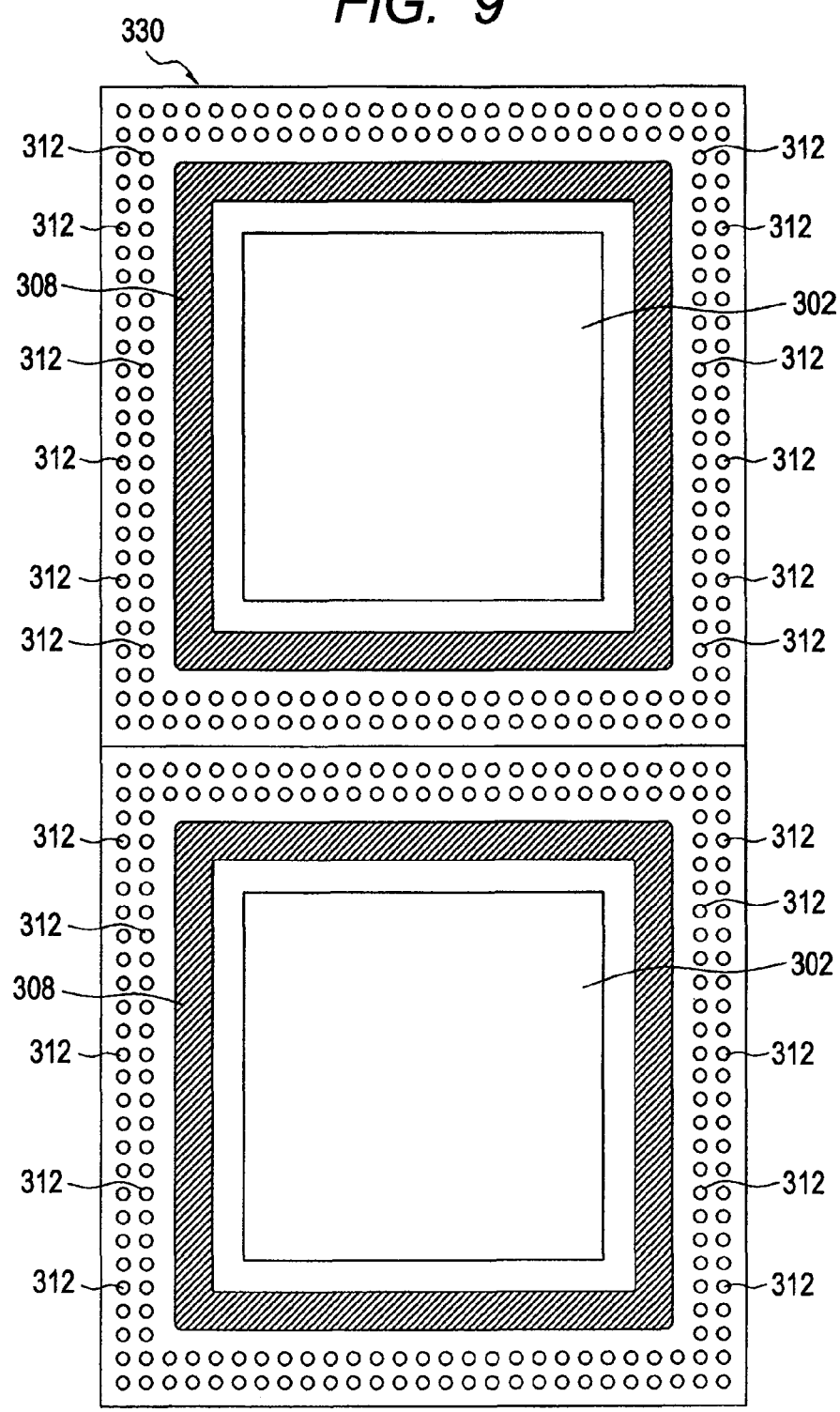
FIG. 9 is a partial enlarged plan view of the matrix substrate, showing a method of manufacturing the first semiconductor package.
Figure 10:
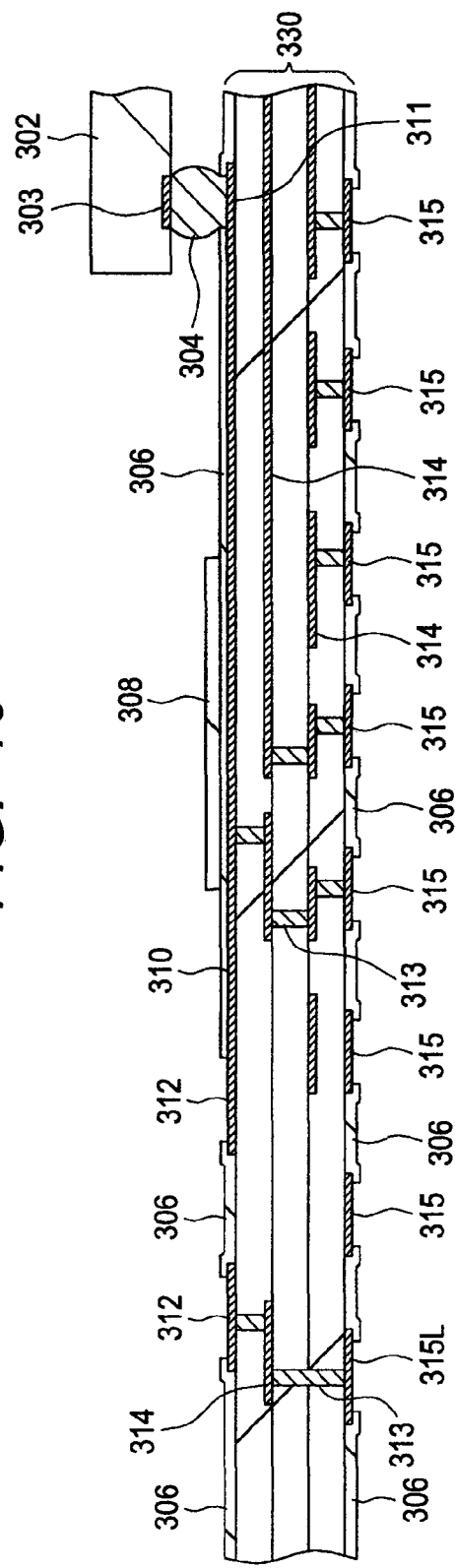
FIG. 10 is a partial enlarged sectional view of the matrix substrate, showing the first semiconductor package manufacturing method.

For fabricating the first semiconductor package 300, first, as shown in FIGS. 9 and 10, controller chips 302 are mounted on the upper surface of the matrix substrate 330 and solder balls (bump electrodes) 304 coupled beforehand to electrode pads 303 of the controller chips 302 are positioned onto bonding leads 311. Subsequently, the matrix substrate 330 is heated within a heating furnace, allowing the solder balls 304 to reflow, thereby coupling the solder balls 304 and the electrode pads 303 with each other.

Figure 11:
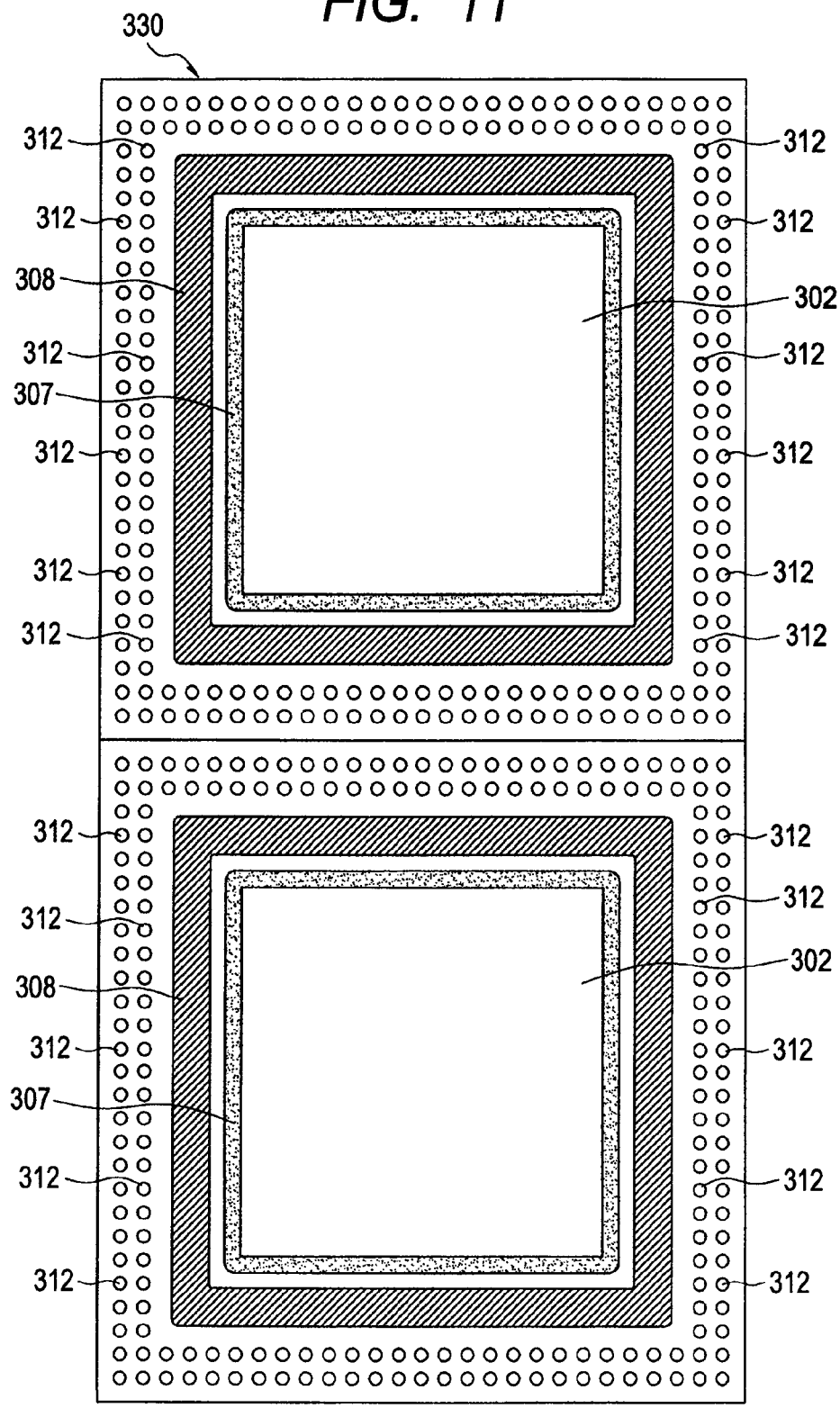
FIG. 11 is a partial enlarged plan view of the matrix substrate, showing the first semiconductor package manufacturing method.
Figure 12:
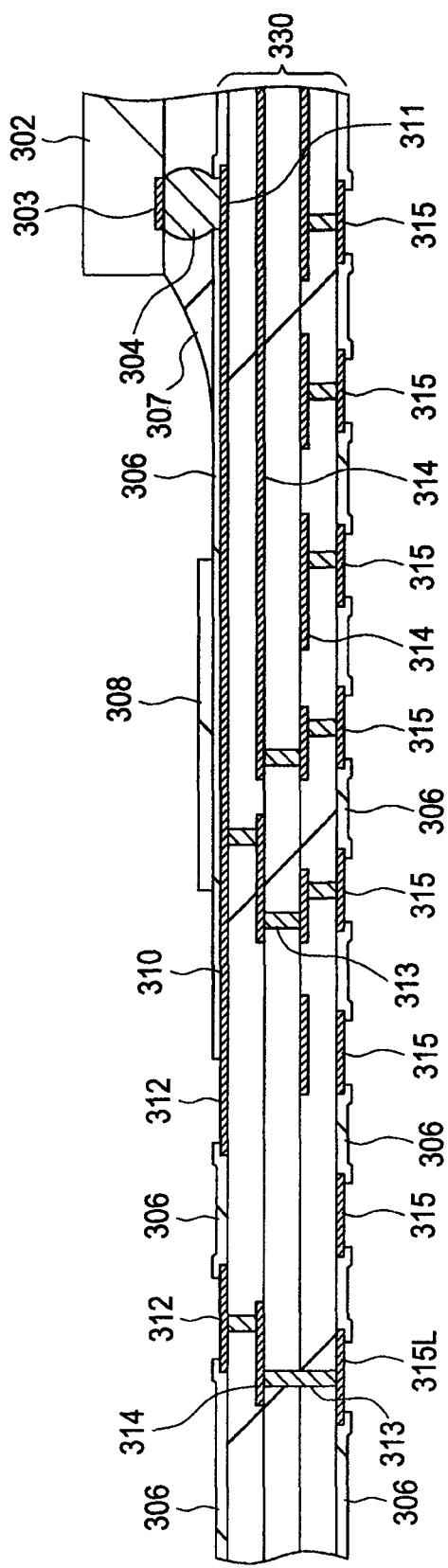
FIG. 12 is a partial enlarged sectional view of the matrix substrate, showing the first semiconductor package manufacturing method.

Next, as shown in FIGS. 11 and 12, liquid underfill resin 307 is supplied between the upper surface of the matrix substrate 330 and main surfaces of the controller chips 302, then the matrix substrate 330 is heated within the heating furnace to cure the underfill resin 307.

Thereafter, the solder balls 305 are coupled to lower surface-side lands 315 formed on the lower surface of the matrix substrate 330, then the matrix substrate 330 is heated within the heating furnace to reflow the solder balls 305, and thereafter the matrix substrate 330 is diced to afford the first semiconductor package 300 shown in FIGS. 1 to 3.

<Electrical Characteristic Tests for the First Semiconductor Package>

Figure 13:
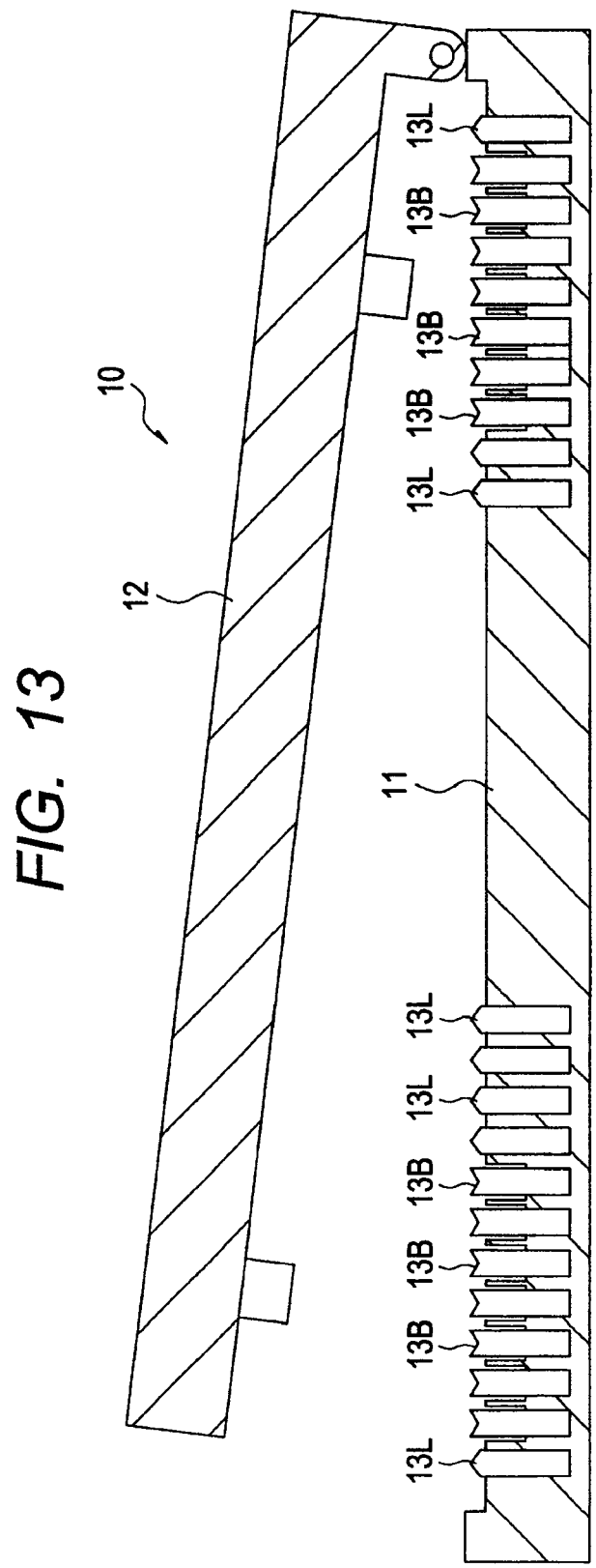
FIG. 13 is a schematic sectional view showing a principal portion of a probe socket used in electrical characteristic tests for the first semiconductor package.

Next, the first semiconductor package (assembly) 300 thus fabricated in the above manner is subjected to electrical characteristic tests. FIG. 13 is a schematic sectional view showing a principal portion of a probe socket 10 used in the electrical characteristic tests for the first semiconductor package 300 and FIG. 14 is a schematic sectional view showing a principal portion of contact pins (a ball coupling contact pin 13B and a land contacting contact pin 13L) which are incorporated in the probe socket 10 shown in FIG. 13.

As shown in FIG. 13, the probe socket 10 includes a socket body 11 and a cap 12 which is attached for opening and closing motion to the socket body 11. In the socket body 11 are incorporated plural ball coupling contact pins 13B and plural land contacting contact pins 13L.

The ball coupling contact pins (first contact pins) 13B are probes for contact with the solder balls 305 attached to the lower surface-side lands 315 of the wiring substrate 301 in the first semiconductor package 300, while the land contacting contact pins 13L are probes for contact with the testing lands 315L. The number of the ball coupling contact pins 13B is the same as the number of the lower surface-side lands 315 formed on the lower surface of the wiring substrate 301, and the number of the land contacting contact pins (second contact pins) 13L is the same as the number of the testing lands 315L.

Figure 14:
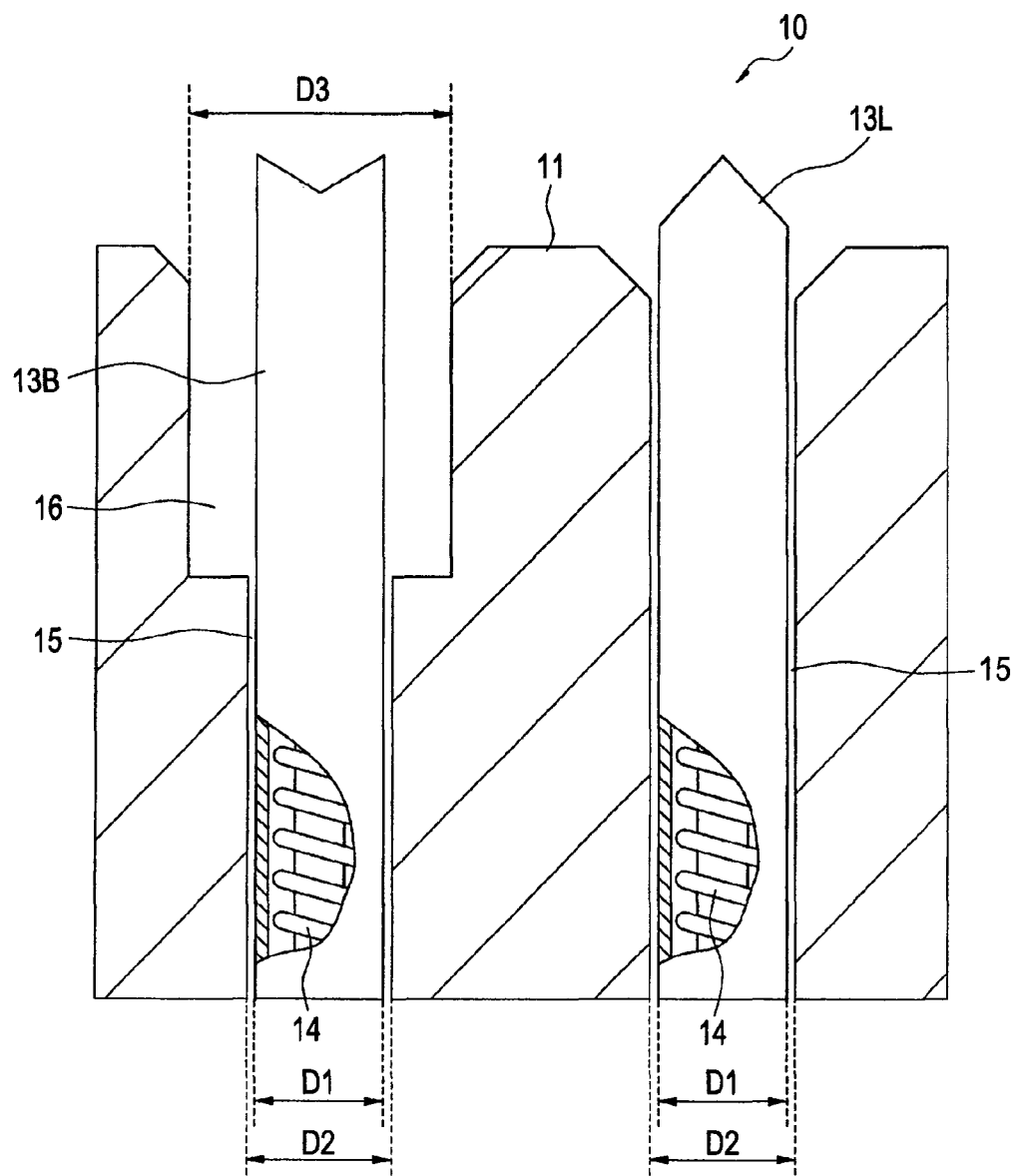
FIG. 14 is a schematic sectional view showing principal portions of contact pins incorporated in the probe socket shown in FIG. 13.

As shown in FIG. 14, the ball coupling contact pins 13B and the land contacting contact pins 13L each have a POGO pin structure in which each contact pin is moved vertically through a pin guide 15 with the biasing force of a coiled spring 14 received within a metallic tube. A lower end portion of each of the ball coupling contact pins 13B and the land contacting contact pins 13L is coupled to a contact probe (not shown) which is incorporated in the socket body 11. In this case, as shown in FIG. 14, in order to permit vertical movements of each of the contact pins 13B, 13L in the interior of the associated pin guide 15, a gap is formed between the inner wall surface of the pin guide 15 and the surface of the contact pin 13B (13L).

Figure 28A:
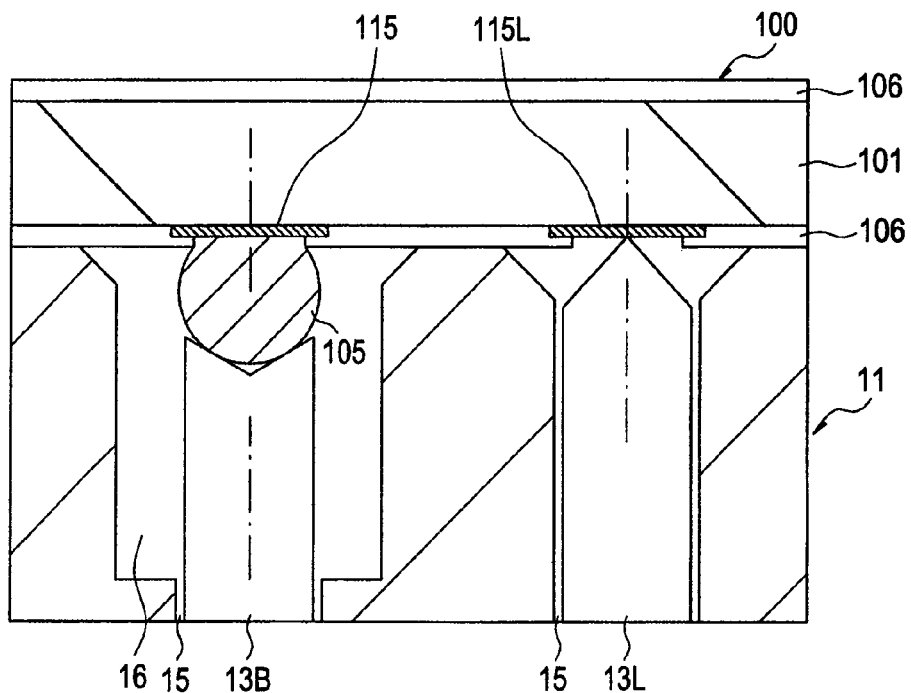
FIGS. 28(a) and 28(b) are schematic sectional views showing contact portions between lands formed on a first wiring substrate in the POP type semiconductor device of FIG. 25 and probes.
Figure 28B:
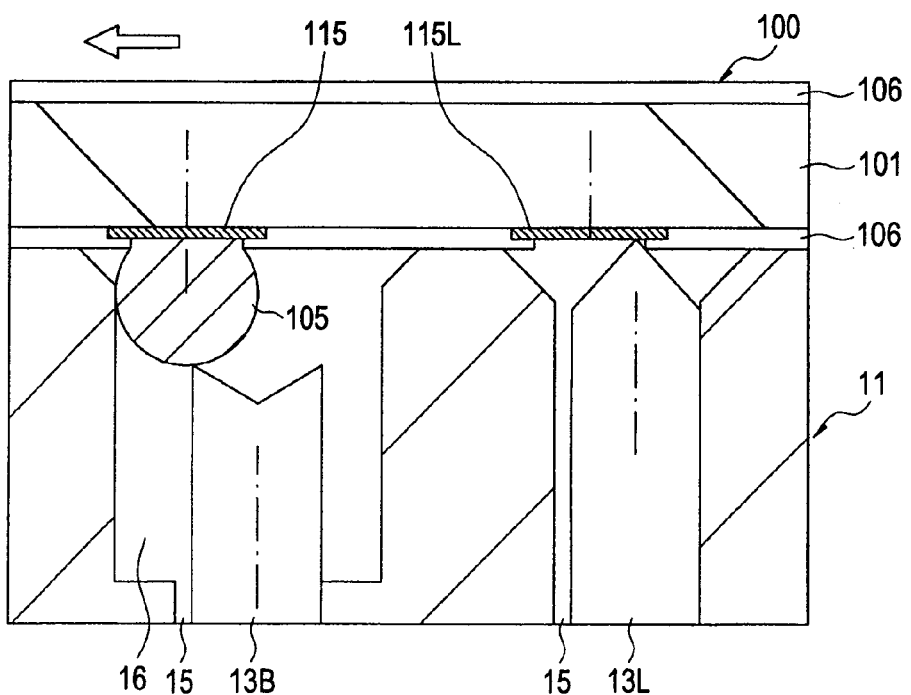
Figure 29:
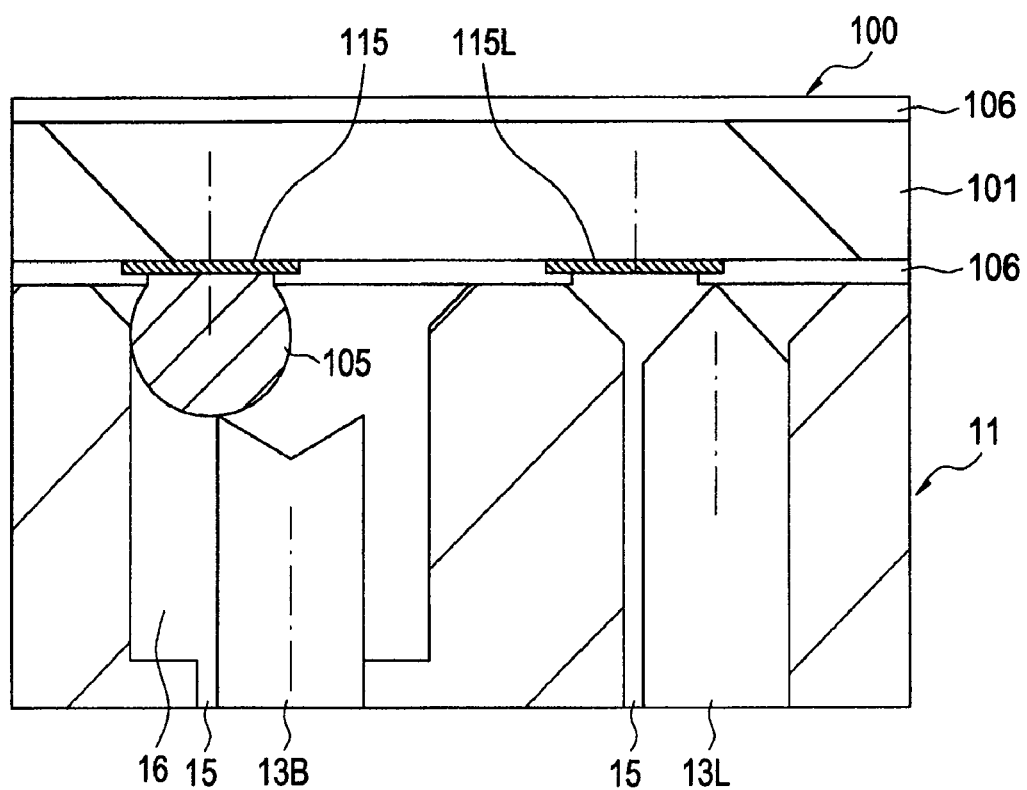
FIG. 29 is a schematic sectional view showing a state of contact imperfection between a land contacting contact pin formed on the first wiring substrate in the POP type semiconductor device of FIG. 25 and a testing land.

A tip portion (upper end portion) of each ball coupling contact pin 13B is formed in a so-called crown shape so as to come in contact with a spherical solder ball 305 at plural points. More specifically, a planar shape of the tip portion (upper end portion) of the ball coupling contact pin 13B, (in FIG. 28, a planar shape of the contact pin 13B as viewed from the lower surface-side land 115 side), is circular and plural projections are arranged (formed) along the peripheral edge of this tip portion. By thus forming the tip portion (upper end portion) of the ball coupling contact pin 13B in a so-called crown shape, it is possible to increase the number of contact points (the area of contact) with the spherical solder ball (bump electrode) 305. On the other hand, a tip portion (upper end portion) of the land contacting contact pin 13L is in a so-called single needle shape which contacts at one point with the testing land 315L which is flat. More particularly, a planar shape of the tip portion (upper end portion) of the land contacting contact pin 13L, (in FIG. 28, a planar shape of the contact pin 13L as viewed from the testing land 115L side), is circular and the vertex of the needle is positioned centrally of the tip portion (upper end portion) of the land contacting contact pin 13L. In other words, one projection is formed centrally of the tip portion (upper end portion) of the land contacting contact pin 13L. Although the illustrated tip portion of the ball coupling contact pin 13B is of a shape adapted to come in contact with the solder ball 305 at two points, it goes without saying that the tip portion may be of a shape adapted to come in contact with the solder ball 305 at three or more points.

Figure 15:
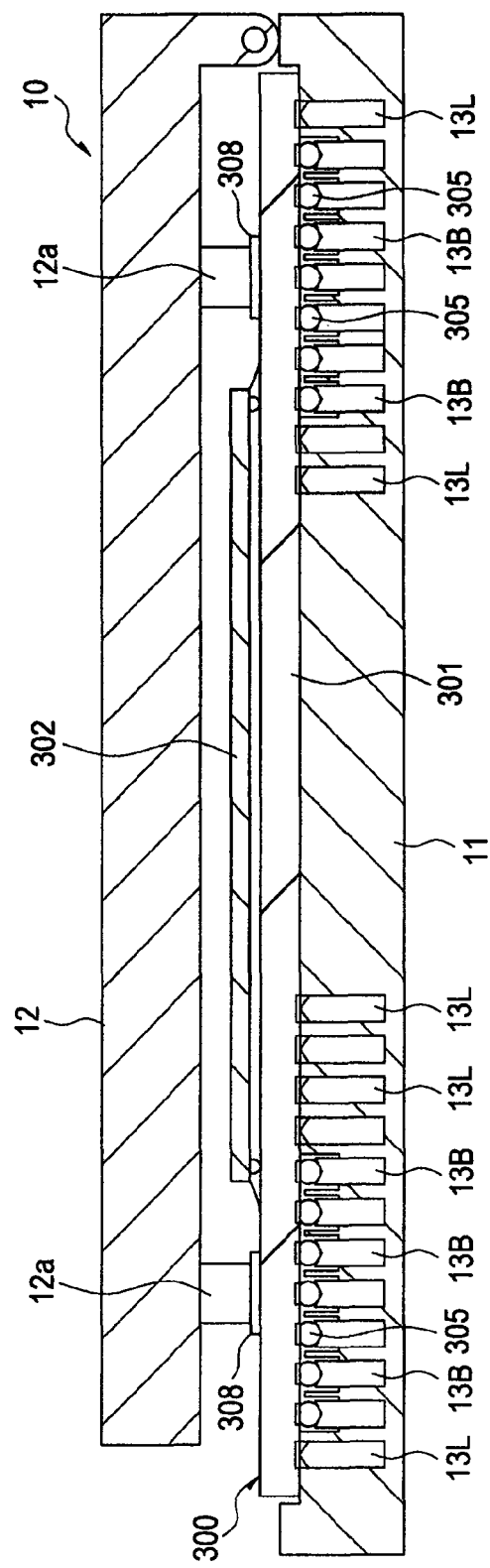
FIG. 15 is a schematic sectional view showing a placed state of the first semiconductor package into the probe socket.

In conducting electrical characteristic tests for the first semiconductor package 300 with use of the probe socket 10 described above, as shown in FIG. 15, the first semiconductor package 300 is positioned onto an upper surface of the socket body 11 and the upper surface of the wiring substrate 301 is forced down from above with the cap 12 and is thereby fixed to the upper surface of the socket body 11. To be more specific, as shown in FIG. 15, a recess (receptacle portion) is formed in the upper surface of the socket body 11 and the first semiconductor package 300 is disposed within the recess of the socket body 11 in such a manner that the lower surface of the first semiconductor package 300 confronts the bottom of the recess.

Thus, by holding down the upper surface of the wiring substrate 301 from above with the cap 12 during electrical characteristic tests for the first semiconductor package 300, warping of the wiring substrate 301 caused for example by the generation of heat from the controller chip 302 mounted on the wiring substrate 301 is suppressed. Consequently, it is possible to suppress a lowering of the alignment accuracy between the lands (the lower surface-side land 315 and the testing land 315L) and the probes (the ball coupling contact pin 13B and the land contacting contact pin 13L), which is caused by warping of the wiring substrate 301.

When holding down the upper surface of the wiring substrate 301 with the cap 12, in order to prevent damage of the upper surface of the wiring substrate 301 caused by contact thereof with the cap 12, a convex portion 12a having a flat bottom is provided on a lower surface of the cap 12 and the bottom of the convex portion 12a is contacted with a dam 308 formed on the upper surface of the wiring substrate 301. Though not shown in FIG. 15, the convex portion 12a has a quadrangular frame-like plane shape like the dam 308 formed on the upper surface of the wiring substrate 301.

Figure 16:
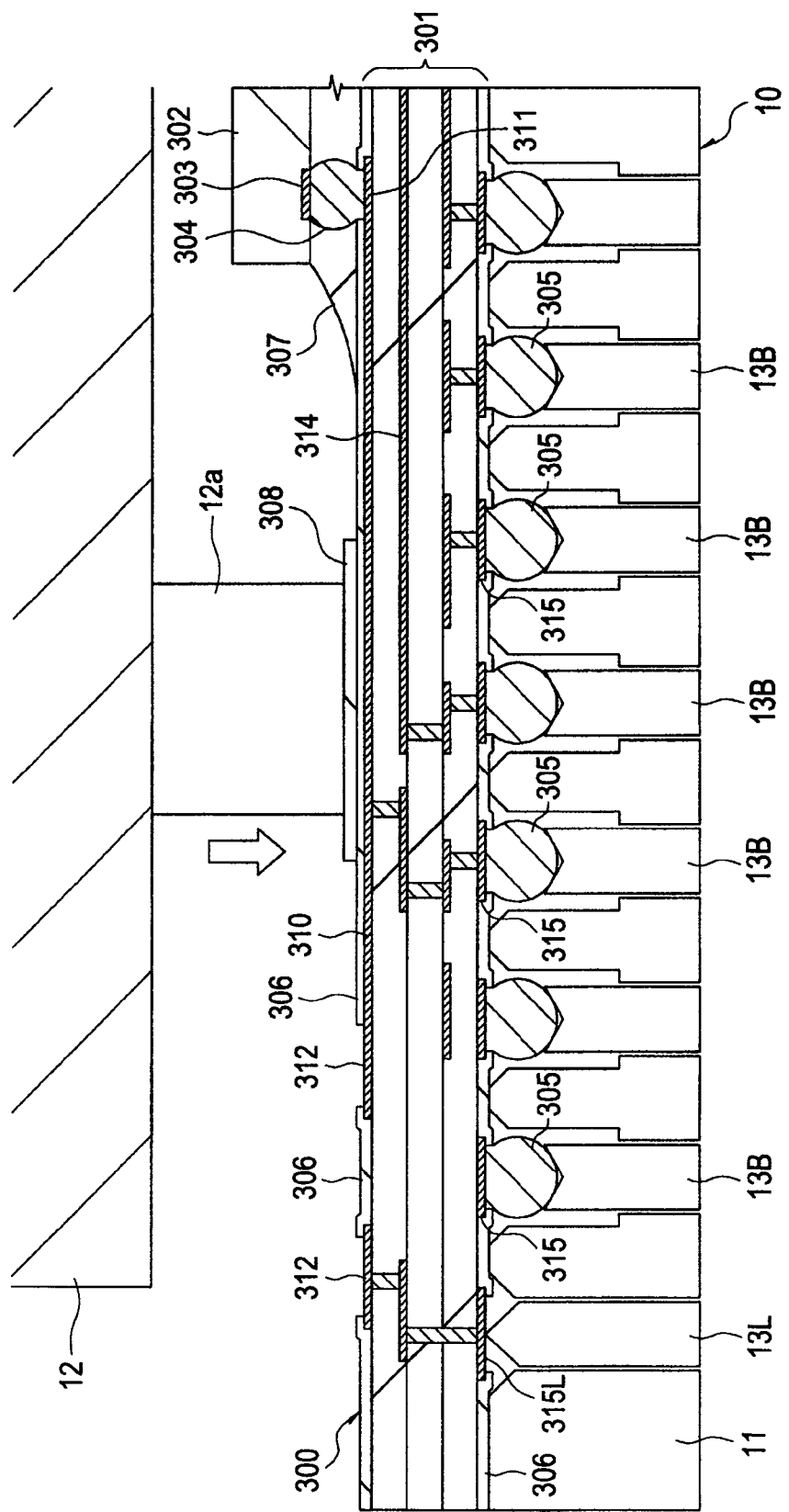
FIG. 16 is an enlarged sectional view showing a contact portion between a convex portion formed on a cap of the probe socket and a dam provided on a wiring substrate.

FIG. 16 is an enlarged sectional view showing a contact portion between the convex portion 12a of the cap 12 and the dam 308 of the wiring substrate 301. As shown in FIG. 16, it is preferable that the width of the dam 308 be larger than the width of the contact area between the convex portion 12a formed on the lower surface of the cap 12 and the dam 308, namely, the width of the bottom of the convex portion 12a. By so doing, the entire bottom of the convex portion 12a contacts with the upper surface of the dam 308, so that a uniform pressing force can be applied to the upper surface of the dam 308. On the other hand, in the case where the width of the dam 308 is made smaller than the width of the convex portion 12a, a part of the bottom of the convex portion 12a becomes out of contact with the upper surface of the dam 308, which may result in that the pressing force applied to the upper surface of the dam 308 becomes non-uniform.

It is preferable that the dam 308 be formed on the upper surface of the wiring substrate 301 at a position at which it planarly overlaps a central portion (near the center) of plural rows of solder balls arranged in a direction of one side from the central part of the wiring substrate 301. In the example shown in FIG. 16, the dam 308 is disposed above the solder ball 305 which is positioned centrally of the seven solder ball rows. With this arrangement, pressing forces applied respectively to the solder ball rows through the convex portion 12a of the cap 12 and the wiring substrate 301 can be made almost equal.

Figure 17:
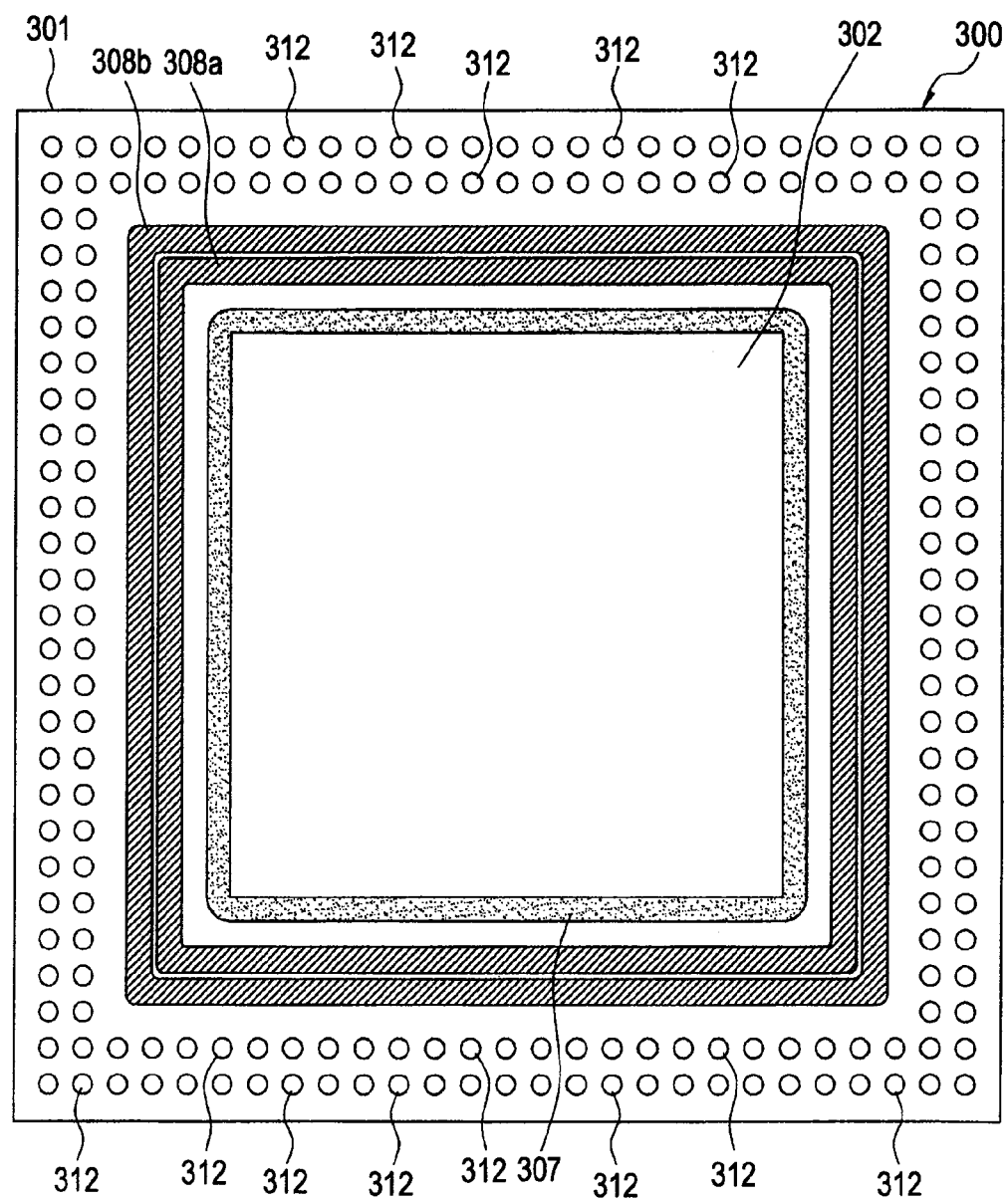
FIG. 17 is a plan view showing another example of a dam provided on the wiring substrate of the first semiconductor package.
Figure 18:
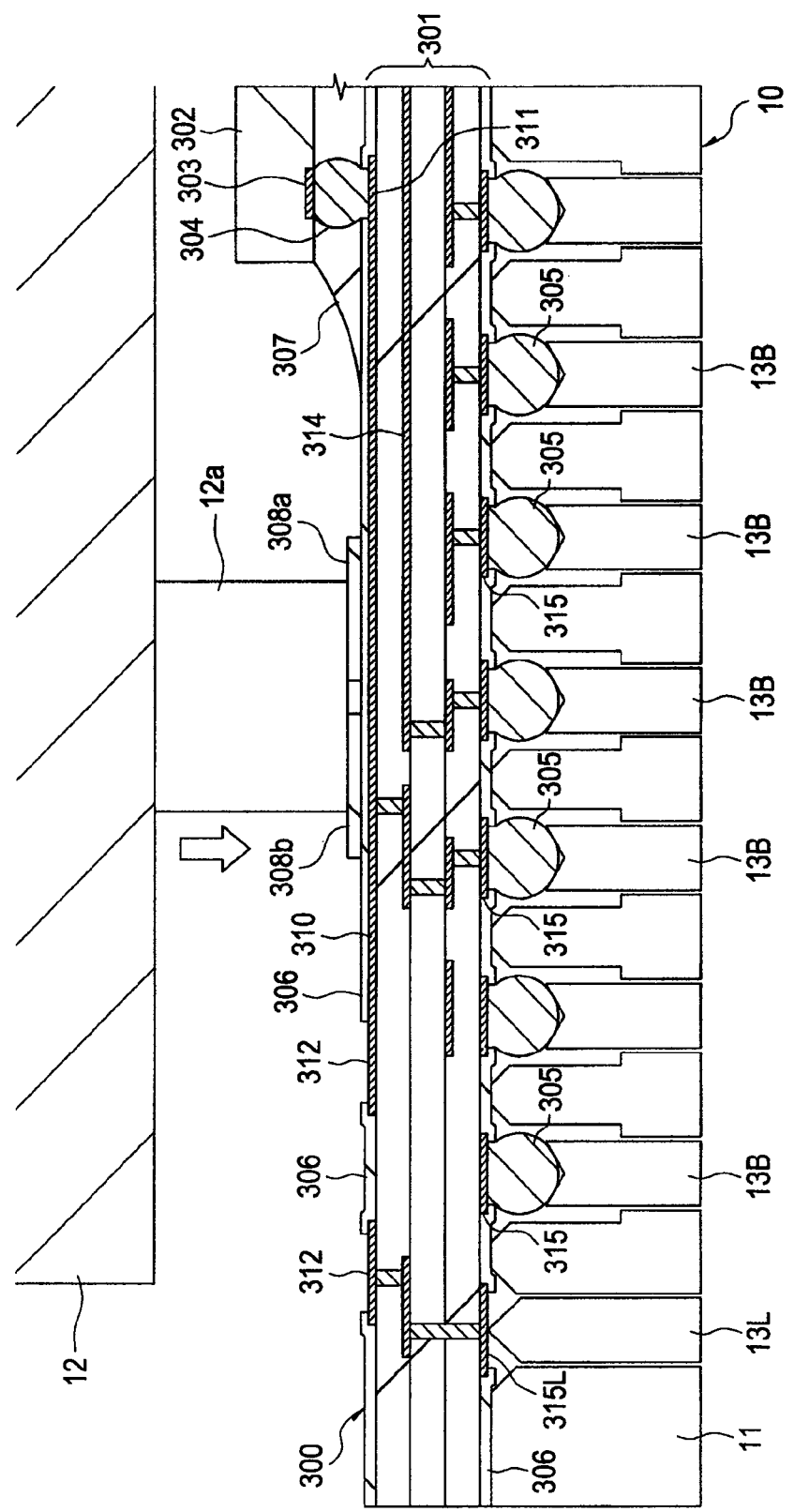
FIG. 18 is an enlarged sectional view showing a contact portion between the convex portion formed on the cap of the probe socket and the dam shown in FIG. 17.

As noted above, one of the purposes for providing the dam 308 on the upper surface of the wiring substrate 301 is to prevent spreading of the liquid underfill resin 307 to the peripheral portion of the wiring substrate 301 which resin is supplied between the upper surface of the wiring substrate 301 and the main surface of the controller chip 302. Therefore, for example as shown in FIG. 17, there sometimes is adopted a configuration such that the controller chip 302 is enclosed double with two dams 308a and 308b for the purpose of enhancing the spread preventing effect of the underfill resin 307. Also in this case, as shown in FIG. 18, by making the dams 308a and 308b wider than the convex portion 12a and by contacting the entire bottom of the convex portion 12*a* with upper surfaces of the dams 308*a* and 308*b*, it is possible to apply a uniform pressing force to the upper surfaces of the dams 308*a* and 308*b*.

In the process (see FIGS. 11 and 12) of supplying the liquid underfill resin 307 between the upper surface of the matrix substrate 330 and the main surface of the controller chip 302, in connection with the method of manufacturing the first semiconductor package 300 described above, the tip of a dispenser nozzle is inserted into a narrow gap between the controller chip 302 and the dam 308 which surrounds the controller chip, and the underfill resin 307 is supplied while the dispenser nozzle is moved along one or two sides of the controller chip 302. Therefore, if the width of the dam 308 is made larger than that of the convex portion 12*a* referred to above, the gap between the controller chip 302 and the dame 308 becomes still narrower and there may occur a case where the tip of the dispenser nozzle cannot be inserted into the gap. In such a case, only two opposed sides out of the four sides of the dam 308 which surround the controller chip 302 may be made wider.

Outside the dam 308 are arranged plural upper surface-side lands 312 which configure one ends of the wiring lines 310, but there sometimes is a case where a certain particular number of the upper surface-side lands 312 makes it difficult to enlarge the width of the dam 308. Also in such a case, only two opposed sides out of the four sides of the dam 308 which surround the controller chip 302 may be made wider.

Figure 19:
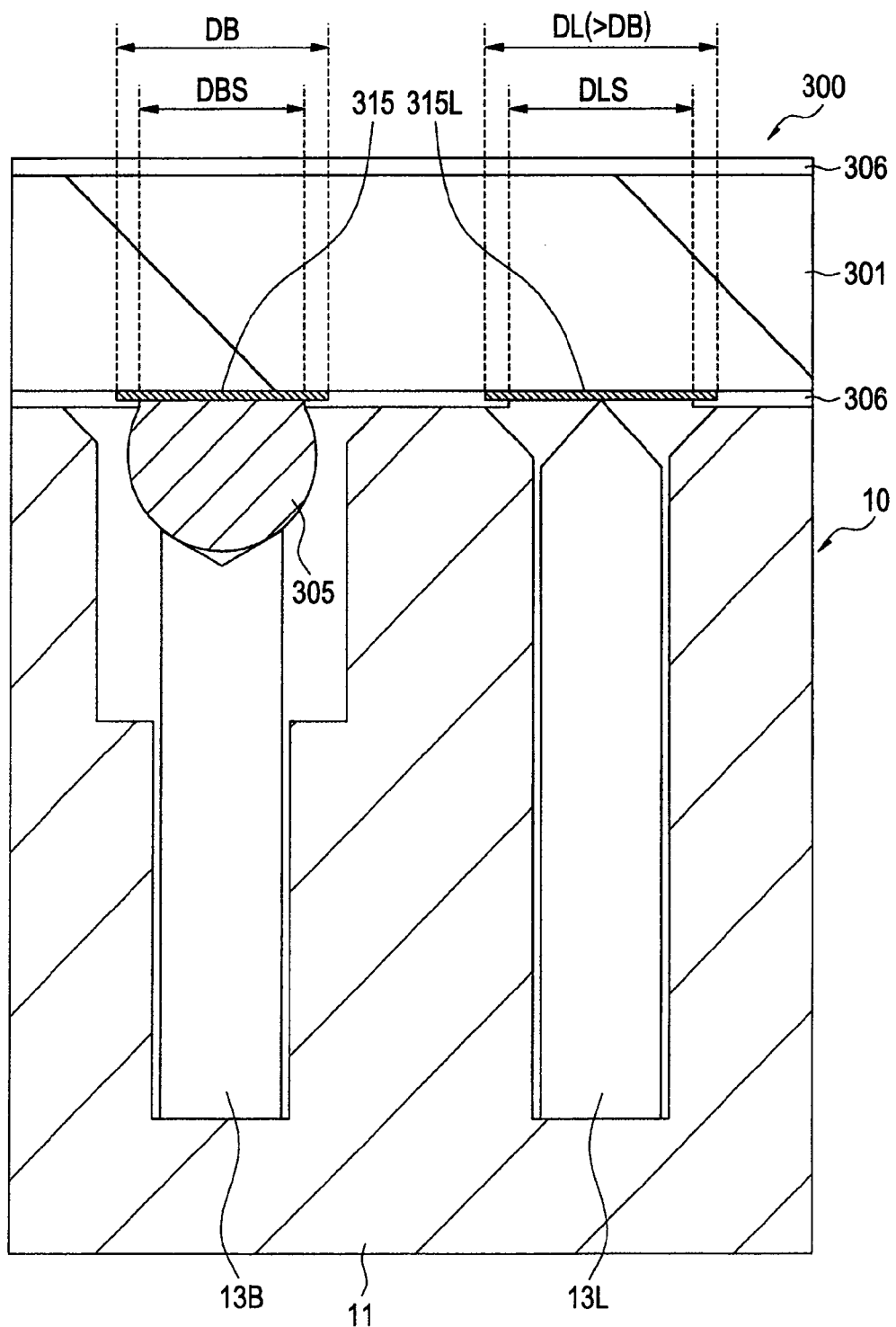
FIG. 19 is a schematic sectional view showing a contact portion between a solder ball coupled to a lower surface-side land of the wiring substrate and a ball coupling contact pin and a contact portion between a testing land and a land contacting contact pin.

FIG. 19 is a schematic sectional view showing a contact portion between a solder ball 305 coupled to a lower surface-side land 315 of the wiring substrate 301 and a ball coupling contact pin 13B and a contact portion between a testing land 315L and a land contacting contact pin 13L.

Dimensional examples of various members will now be shown. For example, the diameter DB of each lower surface-side land 315 is 0.3 mm and the diameter DL of each testing land 315L is 0.33 mm. Peripheral portions of the testing land 315L and the lower surface-side land 315 are each covered with solder resist 306, so if the diameter of the area actually exposed to the lower surface of the wiring substrate 301 is defined as an aperture diameter, the aperture diameter DBS of each lower surface-side land 315 is, for example, 0.23 mm and the aperture diameter DLS of each testing land 315L is, for example, 0.27 mm.

On the other hand, the diameter D1 of each ball coupling contact pin 13B and that of each land contacting contact pin 13L are, for example, 0.15 mm and the diameter D2 of each pin guide 15 is, for example, 0.19 mm. Further, the diameter D3 of the vicinity (ball guide 16) of the tip portion of the pin guide 15 into which the ball coupling contact pin 13B is inserted is, for example, 0.35 mm, given that the diameter of each solder ball 305 is, for example, 0.25 mm.

When the amount of a positional deviation between the ball coupling contact pin 13B and the solder ball 305 and the amount of a positional deviation between the land contacting contact pin 13L and the testing land 315L are each zero, the ball coupling contact pin 13B and the solder ball 305 are aligned with each other and so are the land contacting contact pin 13L and the testing land 315L, as shown in FIG. 19.

However, the positions of the lower surface-side lands 315 and of the testing lands 315L actually formed on the lower surface of the wiring substrate 301 may be deviated from their design positions due to variations in machining of the wiring substrate 301. Likewise, the positions of the ball coupling contact pins 13B and of the land contacting contact pins 13L actually provided in the socket body 11 may be deviated from their design positions due to variations in machining of the socket body 11. Moreover, when the first semiconductor package 300 is placed into the probe socket 10 and is then subjected to electrical characteristic tests, the wiring substrate 301 warps due to the generation of heat from the controller chip 302 mounted on the wiring substrate 301 and there occur positional deviations between the ball coupling contact pins 13B and the solder balls 305 and between the land contacting contact pins 13L and the testing lands 315L particularly in the vicinity of the peripheral portion of the wiring substrate 301.

Consequently, as the outline dimensions of the wiring substrate 301 becomes smaller and the diameter of each land (each of the lower surface-side lands 315 and testing lands 315L) formed on the lower surface of the wiring substrate 301, as well as the land-to-land pitch, become smaller with the reduction in size of the POP type semiconductor device, contact imperfection becomes easier to occur particularly between each testing land 315L with a solder ball 305 not coupled thereto and the associated land contacting contact pin 13L, as noted previously.

To avoid such an inconvenience, in the first semiconductor package 300 of this embodiment, the diameter DL of each testing land 315L formed on the lower surface of the wiring substrate 301 is set larger than the diameter DB of each lower surface-side land 315. As a result, the aperture diameter DLS of the testing land 315L also becomes larger than the aperture diameter DBS of the lower surface-side land 315, so that the outline dimensions of the wiring substrate 301 is reduced and the diameter of each land (each of the lower surface-side lands 315 and testing lands 315L), as well as the land-to-land pitch, become smaller, thus making it possible to suppress the occurrence of contact imperfection between the testing land 315L and the land contacting contact pin 13L.

Figure 20:
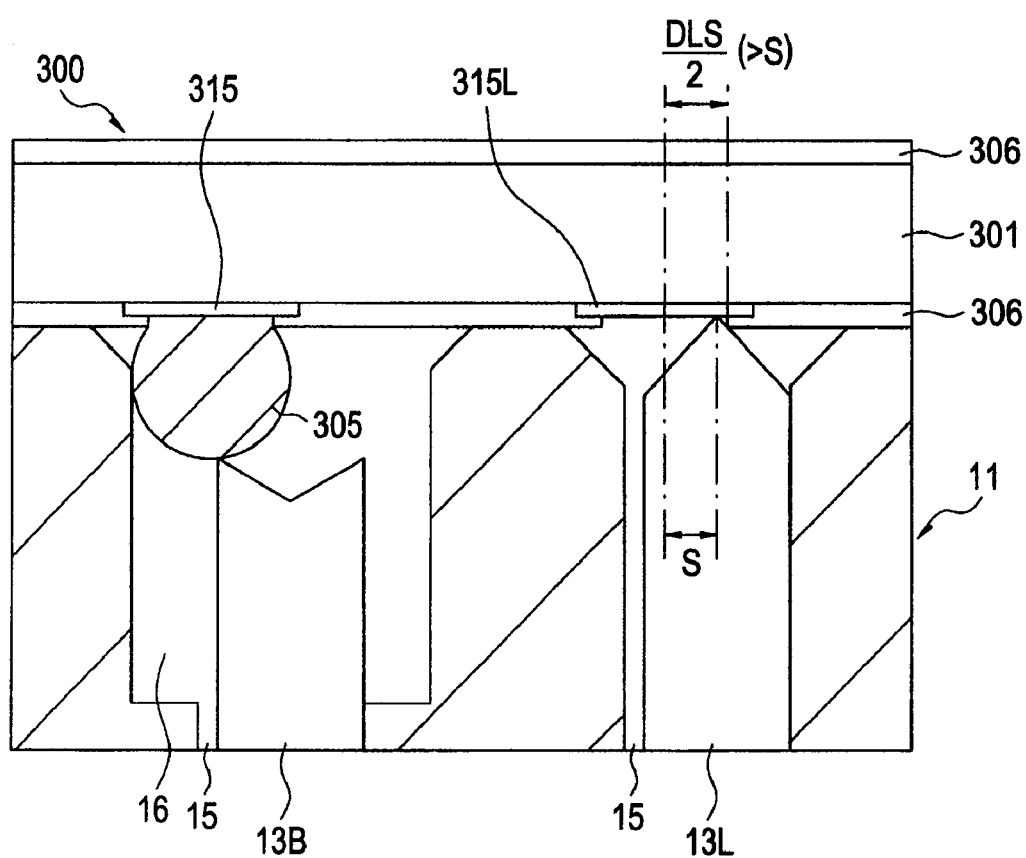
FIG. 20 is an explanatory diagram showing a maximum state of the amount of a positional deviation between the land contacting contact pin and the testing land.

FIG. 20 shows a state in which the amount of a positional deviation between the land contacting contact pin 13L and the testing land 315L is maximum due to variations in machining of the wiring substrate 301 and the socket body 11 or due to warping of the wiring substrate 301 as described above. If the distance from the center of the testing land 31L to the tip of the land contacting contact pin 13L in this state is defined to be a maximum value S of the aforesaid positional deviation quantity, then by setting the aperture radius (DLS/2) of the testing land 315L larger than the maximum value S of the positional deviation quantity, it is possible to surely prevent non-contact between the testing land 315L and the land contacting contact pin 13L.

The solder ball 305 coupled to the lower surface-side land 315 projects lower than the lower surface of the wiring substrate 301, and the shape of the tip portion (upper end portion) of the ball coupling contact pin 13B is a so-called crown shape which contacts at plural points with the spherical solder ball 305. Thus, there is no fear of the two assuming a state of non-contact even when the aperture radius (DBS/2) of the solder ball 305 becomes smaller than the maximum value S of the foregoing positional deviation quantity.

Next, in this state, various electrical characteristic tests are performed for the first semiconductor package 300. The electrical characteristic tests include, for example, a test to check whether wiring paths from the controller chip 302 on the wiring substrate 301 to the testing lands 315L are in conduction or not, an AC/DC test for the controller chip 302, and a test to check whether wiring paths from the controller chip 302 to the solder balls 305 are in conduction or not.

According to this embodiment, even when the outline dimensions of the wiring substrate 301 become smaller with the reduction in size of the POP type semiconductor device, electrical characteristic tests for the first semiconductor package 300, which tests use the testing lands 315L, can be done with high accuracy, thus making it possible to promote the reduction in size of the POP type semiconductor device.

Figure 25:
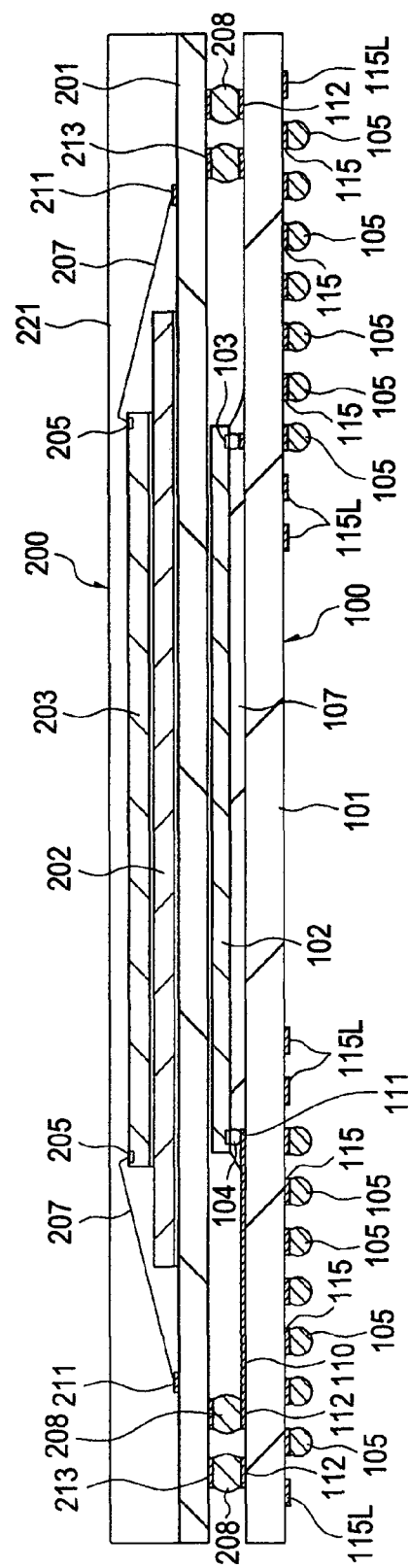
FIG. 25 is a sectional view showing an entire configuration of a POP type semiconductor device which the present inventors have studied.
Figure 26:
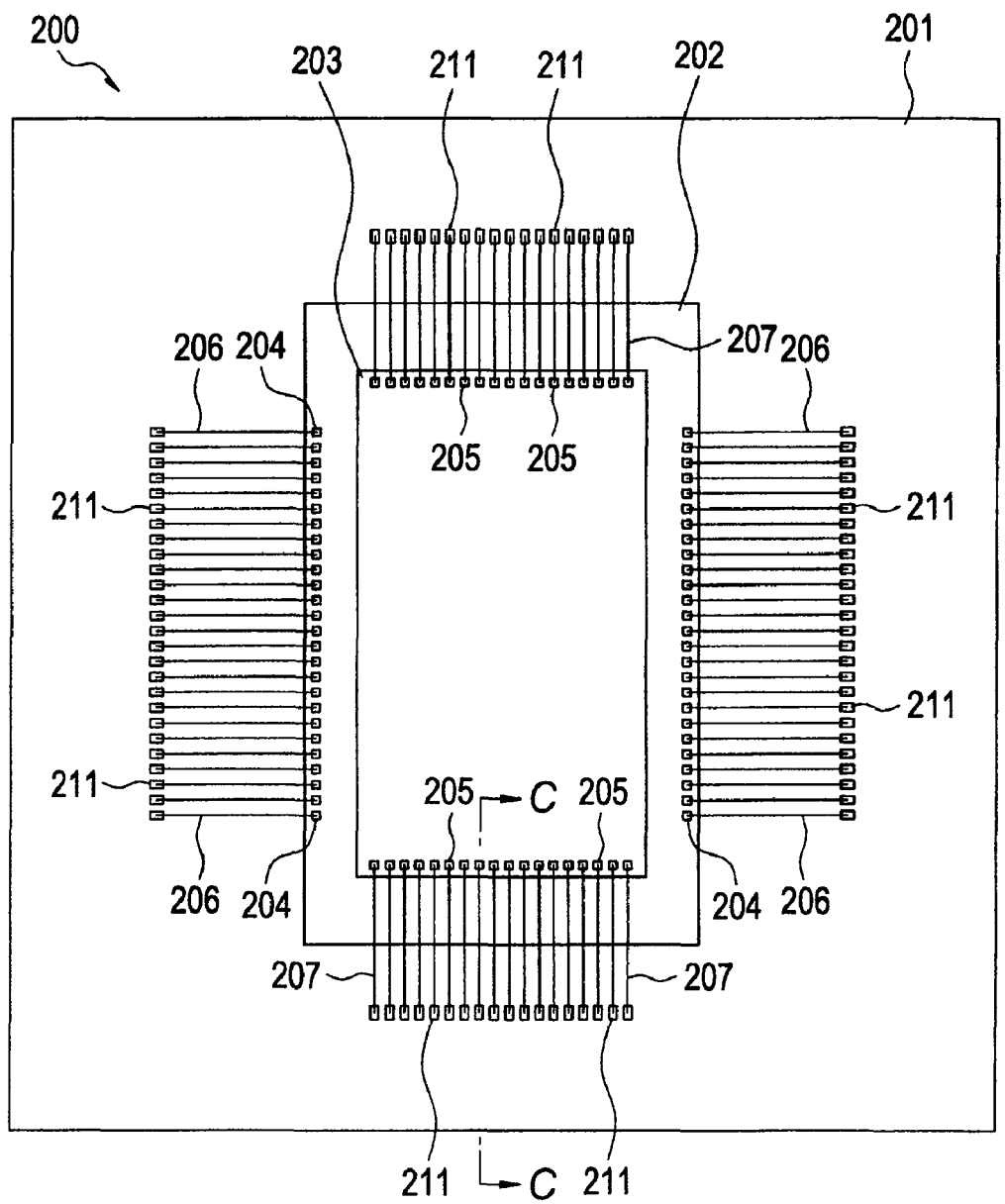
FIG. 26 is a plan view showing a second wiring substrate in the POP type semiconductor device of FIG. 25.
Figure 27:
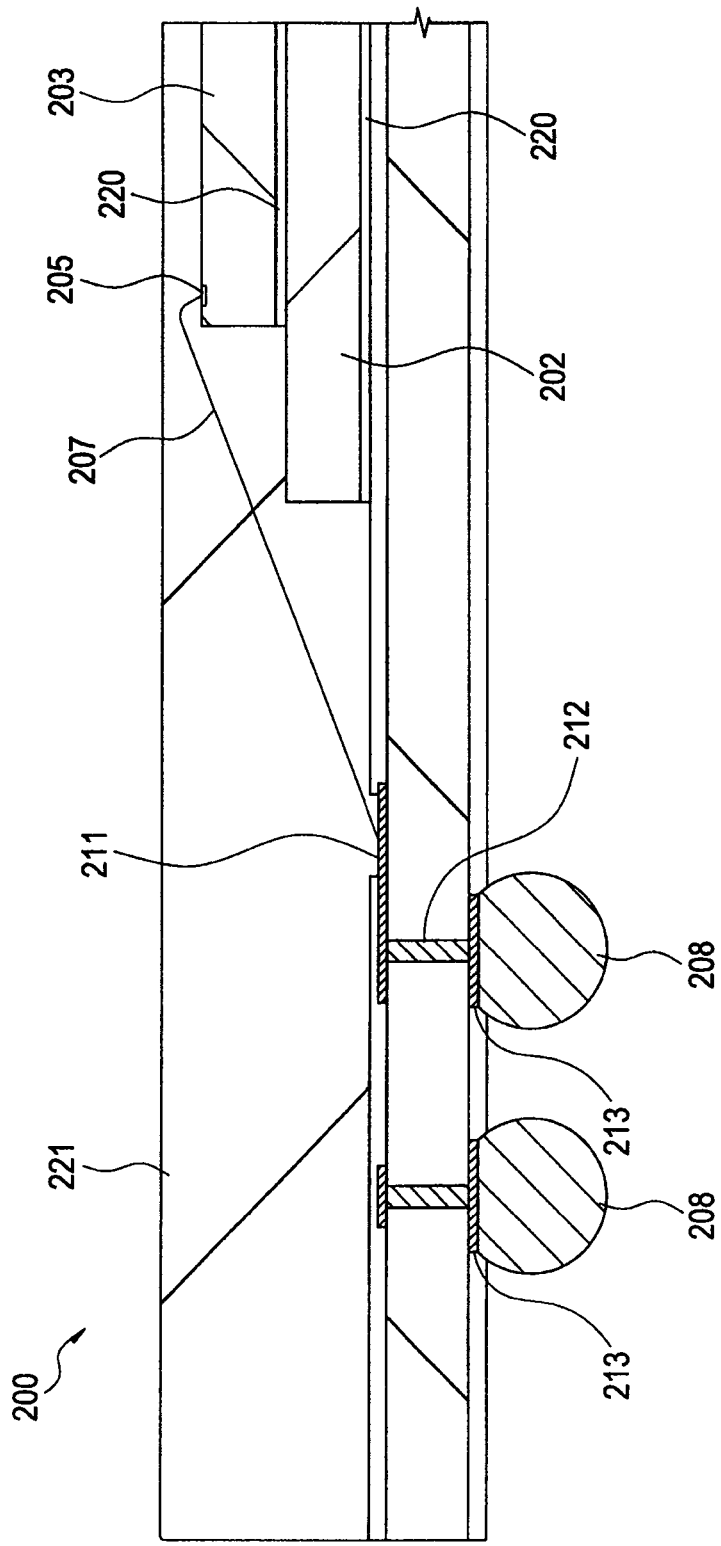
FIG. 27 is a sectional view taken along line C-C in FIG. 26.

In this way the above electrical characteristic tests are performed for each of the first semiconductor packages (assemblies) 300 obtained from the matrix substrate 330 to select non-defective, first semiconductor packages 300. Thereafter, the second semiconductor package (assembly) 200 shown for example in FIGS. 25 to 27 is stacked over each of the non-defective, first semiconductor packages 300, whereby the POP type semiconductor device of this embodiment can be obtained.

Figure 21:
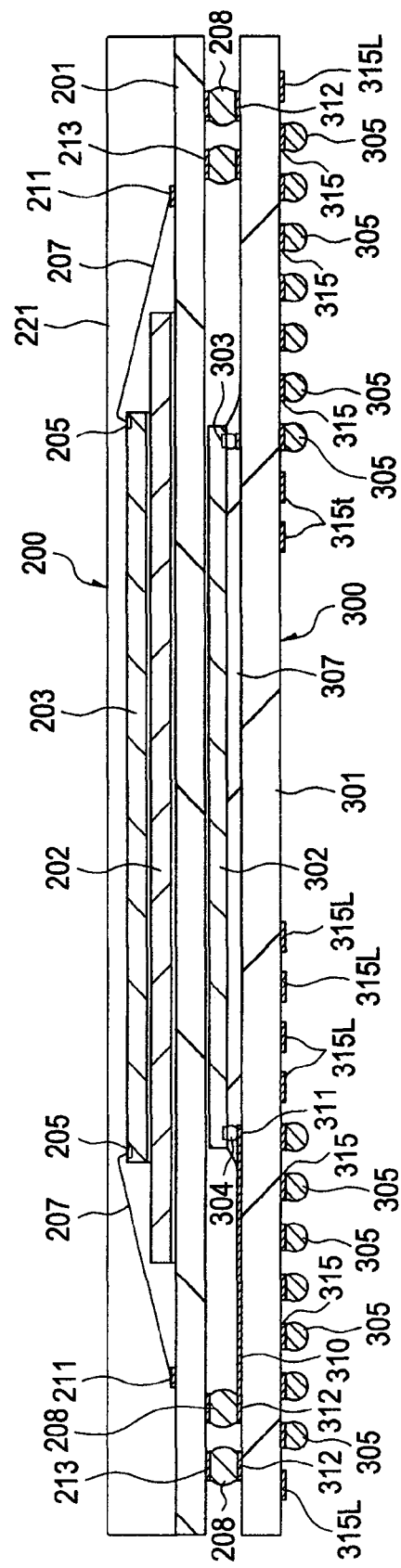
FIG. 21 is a sectional view showing an entire configuration of the POP type semiconductor device of the embodiment.

FIG. 21 is a sectional view showing an entire configuration of the POP type semiconductor device after completion of its assembly. As to the configuration of the second semiconductor package 200 stacked over the first semiconductor package 300 in the POP type semiconductor device, it has been described previously and therefore a repeated explanation thereof is here omitted. Also as to the method of stacking the second semiconductor package 200 over the first semiconductor package 300, an explanation thereof is here omitted because it may be the same as the above method of stacking the second semiconductor package 200 over the first semiconductor package 100.

Regarding how to assemble the POP type semiconductor device described above, two methods are available. According to one method, a semiconductor manufacturer stacks the second semiconductor package 200 over the first semiconductor package 300 and ships the resultant assembly as a finished product. According to the other method, a customer who has bought the first semiconductor package 300 from a semiconductor manufacturer stacks a second package 200 which the customer has selected according to the purpose of use of an electronic device onto the first semiconductor package 300.

Although the present invention has been described above concretely by way of an embodiment thereof, it goes without saying that various changes may be made within the scope not departing from the gist of the invention.

For example, although in the above embodiment the controller chip 302 mounted on the upper surface of the wiring substrate 301 of the first semiconductor package 300 is coupled electrically to electrode pads of the wiring substrate 301 through solder balls (bump electrodes) 304 as conductive members, it may be coupled electrically to the electrode pads of the wiring substrate 301 through wires. The material of the wires is gold (Au) for example.

Figure 22:
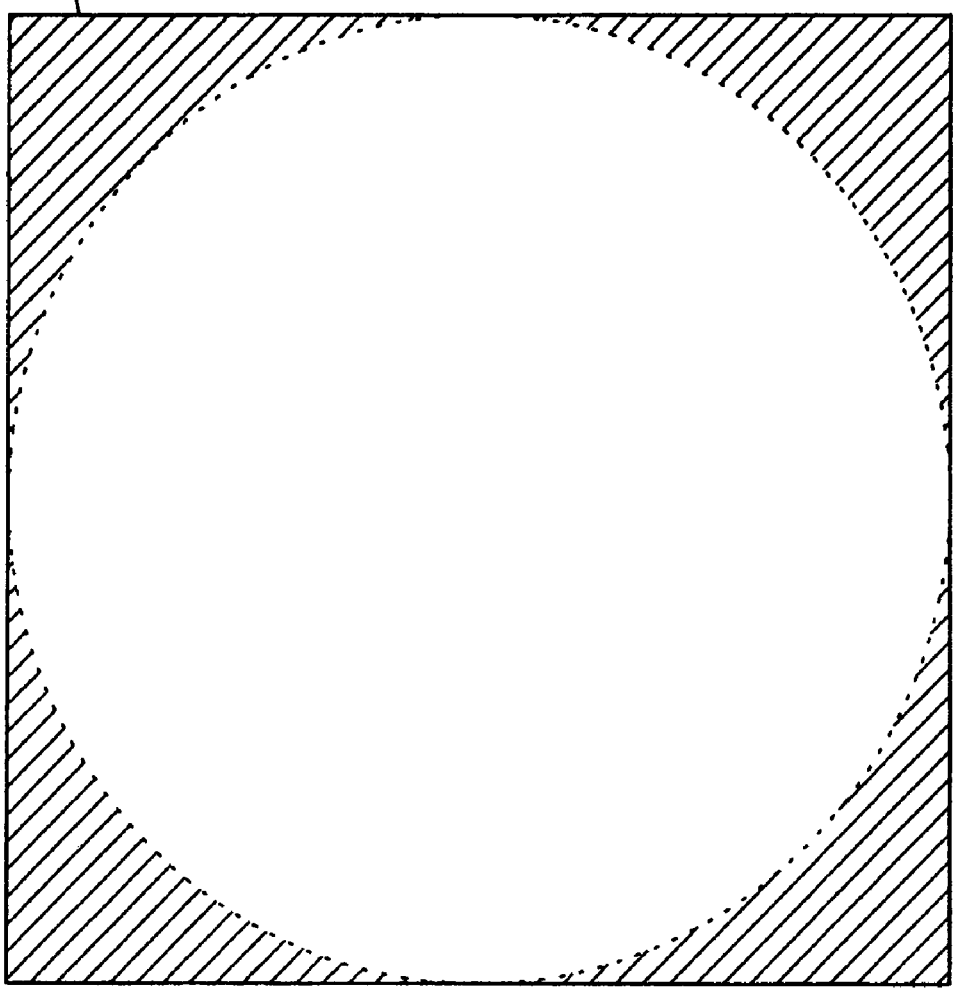
FIG. 22 is a plan view showing another example of a testing land formed on the lower surface of the wiring substrate.

As shown in FIG. 22, the testing lands 315L formed on the lower surface of the wiring substrate 301 may have a quadrangular plane shape. In this case, though not shown in FIG. 22, an aperture shape of each testing land 315L not covered with solder resist is also made quadrangular. For example, in the case where the planar shape of each testing land 315L is made square, the area thereof increases about 1.27 times (the hatched portion in FIG. 22) as compared with a circle having a diameter of the same length as one side of the square, thus making it possible to suppress more effectively the occurrence of contact imperfection between the testing land 315L and the land contacting contact pin 13L.

Figure 23:
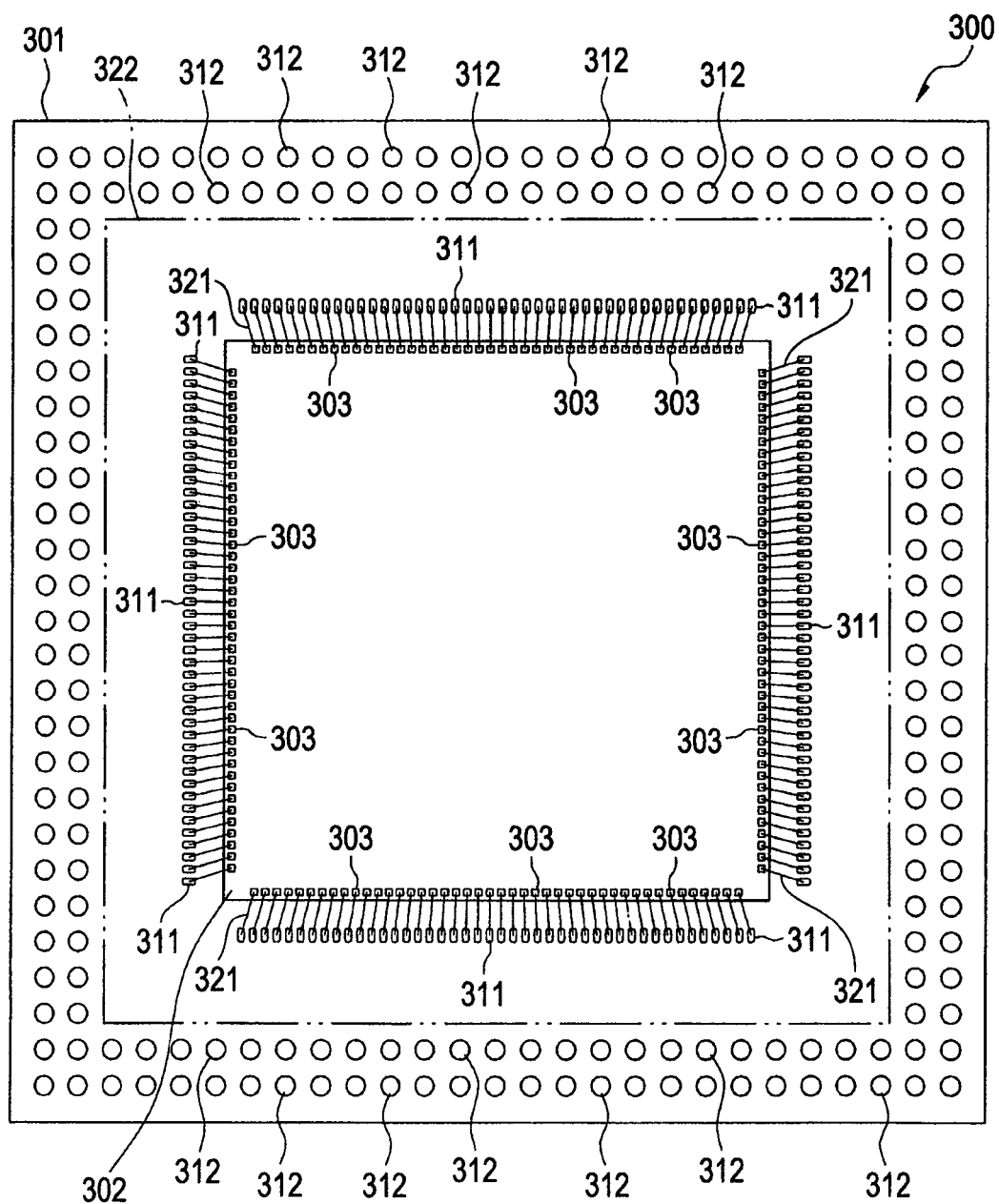
FIG. 23 is a plan view showing another example of the first semiconductor package.
Figure 24:
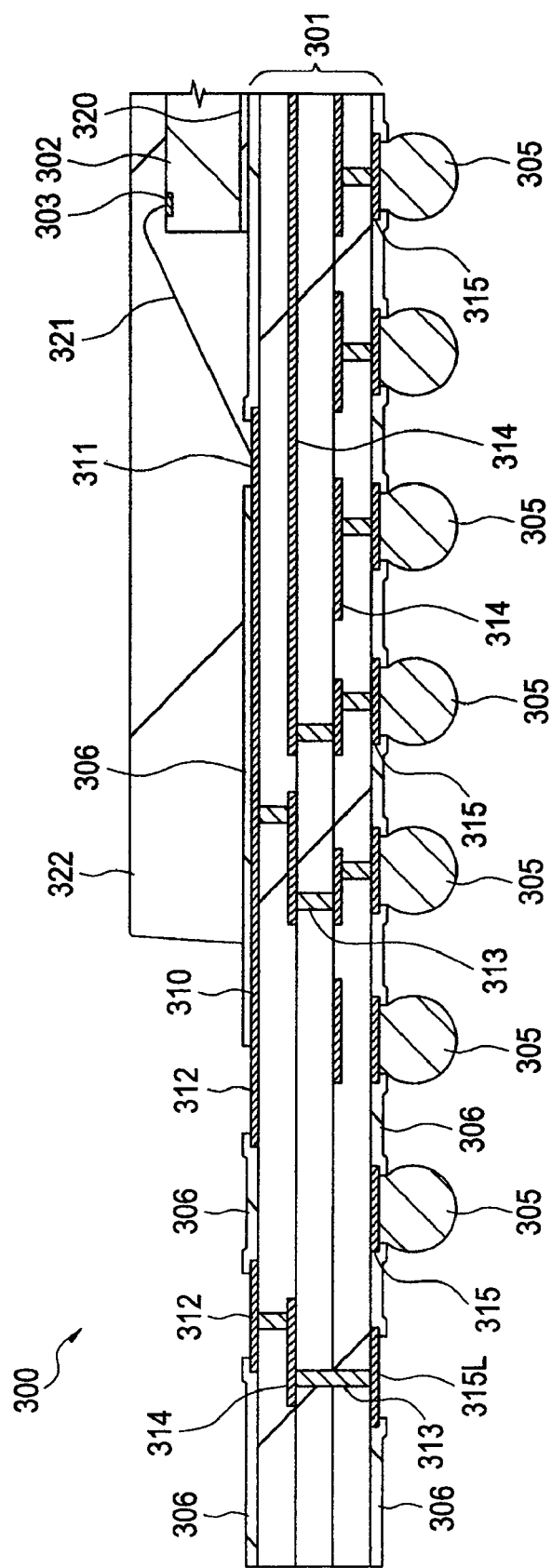
FIG. 24 is an enlarged sectional view of a principal portion of the other example of the first semiconductor package.

Although in the first semiconductor package 300 of the above embodiment the controller chip 302 is flip-chip-mounted onto the upper surface of the wiring substrate 301, there may be adopted such a method as shown in FIGS. 23 and 24, in which the controller chip 302 is face-up-mounted onto the upper surface of the wiring substrate 301 through an adhesive 320 and the electrode pads 303 on the main surface of the controller chip 302 and the bonding leads 311 on the upper surface of the wiring substrate 301 are coupled together electrically through Au wires 321. In this case, the controller chip 302, Au wires 321 and bonding leads 311 are sealed with a resinous sealing body 322.

Figure 30:
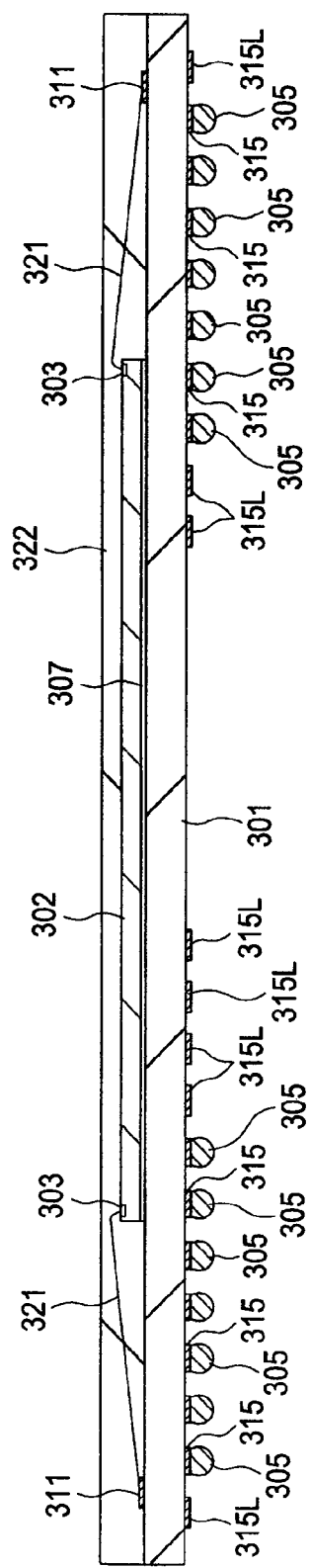
FIG. 30 is a sectional view showing an entire configuration of a BGA type semiconductor device according to a modification of the embodiment of the present invention.

Although in the above embodiment the present invention is applied to the POP type semiconductor device, the present invention may be applied to, for example, a SiP (System in Package) type semiconductor device. The present invention is further applicable to other semiconductor devices having a surface mount package form such as BGA (Ball Grid Array) in which on the upper surface of the wiring substrate 301 there are formed only electrode pads (bonding leads 311) which are coupled electrically to electrode pads (bonding leads) 303 of a chip (e.g., controller chip 302) mounted on the upper surface of the wiring substrate 301, as shown in FIG. 30. In other words, electrode pads (upper surface-side lands 312) coupled electrically to the second semiconductor package 200 are not formed on the upper surface of the wiring substrate 301. This is for the following reason. As noted above, the present invention takes measures against the problem which arises at the time of performing electrical characteristic tests for the assembly including the wiring substrate 301, the wiring substrate 301 having lower surface-side lands (first lands) 315 with solder balls 305 as external terminals coupled thereto and testing lands (second lands) 315L with solder balls 305 as external terminals not coupled thereto and which are used only at the time of electrical characteristic tests for the semiconductor device (assembly). That is, the above embodiment takes note of the problem that as the diameter of each land (315, 315L) becomes smaller with the reduction in size of the semiconductor device, the probe-land alignment accuracy is deteriorated and in the worst case a probe and a land become out of contact with each other, thus resulting in that it becomes no longer possible to carry out accurate electrical characteristic tests. Thus, no limitation is made to the POP type semiconductor device.

The present invention is applicable to a surface mount package type semiconductor device which is subjected to electrical characteristic tests using testing lands provided on a lower surface of a wiring substrate with a chip mounted thereon.

What is claimed is:

1. A method of manufacturing a semiconductor device, comprising the steps of:
(a) providing an assembly including a wiring substrate having an upper surface, a first electrode pad formed on the upper surface, a second electrode pad formed on the upper surface, a lower surface opposed to the upper surface, a first land formed on the lower surface and coupled with the first electrode pad, a second land formed on the lower surface and coupled with the second electrode pad, and a conductive member formed on the first land serving as an external terminal, and a semiconductor chip mounted over the upper surface of the wiring substrate, the second land having a diameter larger than the diameter of the first land; and
(b) placing the assembly into a probe socket, and contacting a first contact pin of the probe socket with the conductive member, and contacting a second contact pin of the probe socket with the second land, and performing electrical characteristic tests for the assembly,
wherein the conductive member is not contacted with the second land and the second land is used only for performing electrical characteristic tests for the semiconductor device.

2. A method according to claim 1,
wherein a tip portion of the first contact pin has a circular plane shape,
wherein a plurality of projections are formed along a peripheral edge of the tip portion of the first contact pin,
wherein a tip portion of the second contact pin has a circular plane shape, and
wherein one projection is formed centrally of the tip portion of the second contact pin.

3. A method according to claim 2,
wherein the probe socket includes a first pin guide, a ball guide connected with the first pin guide, and a socket body provided with the second pin guide,
wherein the first contact pin is disposed within the first pin guide,
wherein the second contact pin is disposed within the second pin guide,
wherein a gap is formed between a surface of the first contact pin and an inner wall surface of the first pin guide, likewise a gap is formed between a surface of the second contact pin and an inner wall surface of the second pin guide, and
wherein in the step (b) the assembly is received within a recess of the socket body in such a manner that the lower surface of the wiring substrate confronts a bottom of the recess of the socket body and that the conductive member is positioned within the ball guide.

4. A method according to claim 3,
wherein over the upper surface of the wiring substrate is formed a dam around the semiconductor chip,
wherein the wiring substrate has a quadrangular plane shape,
wherein the first land is formed in plural rows and the plural rows of the first lands are arranged from a central part of the lower surface of the wiring substrate toward one side of the lower surface of the wiring substrate,
wherein the dam is disposed over the upper surface of the wiring substrate at a position at which the dam planarly overlaps a central part of the first land rows, and
wherein in the step (b) a convex portion provided over a cap of the probe socket is pushed against the dam, thereby contacting the first contact pin of the probe socket with the conductive member and contacting the second contact pin of the probe socket with the second land, and performing electrical characteristic tests for the assembly.

5. A method according to claim 4,
wherein the second land has a quadrangular plane shape.

* * * * *